(12) United States Patent
Lee et al.

(10) Patent No.: US 12,334,390 B2
(45) Date of Patent: *Jun. 17, 2025

(54) SEMICONDUCTOR DEVICE

(71) Applicant: Taiwan Semiconductor Manufacturing Company, Ltd., Hsinchu (TW)

(72) Inventors: Hsin-Yi Lee, Hsinchu (TW); Cheng-Lung Hung, Hsinchu (TW); Da-Yuan Lee, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,825

(22) Filed: Feb. 26, 2024

(65) Prior Publication Data

US 2024/0243008 A1  Jul. 18, 2024

Related U.S. Application Data

(63) Continuation of application No. 17/874,300, filed on Jul. 27, 2022, now Pat. No. 11,923,240, which is a
(Continued)

(51) Int. Cl.
*H01L 21/768* (2006.01)
*H01L 21/027* (2006.01)
*H10D 64/01* (2025.01)

(52) U.S. Cl.
CPC .... *H01L 21/76802* (2013.01); *H01L 21/0274* (2013.01); *H10D 64/017* (2025.01)

(58) Field of Classification Search
CPC ........... H01L 21/76802; H01L 21/0274; H01L 29/66545; H01L 21/823431; H01L 27/0886; H01L 29/0673; H01L 29/1079; H01L 29/42376; H01L 29/42392; H01L 29/4941; H01L 29/66439; H01L 29/78696; H01L 29/517; H01L 29/4966; H01L 29/775; B82Y 10/00; H10D 64/017; H10D 30/014; H10D 30/43; H10D 30/6757; H10D 64/691; H10D 30/6735; H10D 62/121; H10D 62/364; H10D 64/518;
(Continued)

(56) References Cited

U.S. PATENT DOCUMENTS 9,209,247 B2  12/2015 Colinge et al.
9,236,267 B2  1/2016 De et al.
(Continued)

*Primary Examiner* — Caleen O Sullivan
(74) *Attorney, Agent, or Firm* — JCIPRNET

(57) ABSTRACT

A semiconductor device includes a substrate, a first gate structure, and a second gate structure. The first gate structure is disposed on the substrate. The first gate structure includes a first capping layer and a first underlying layer below the first capping layer. The second gate structure is disposed on the substrate. The second gate structure includes a second capping layer and a second underlying layer below the second capping layer. The material of the first capping layer and the second capping layer have a material having higher resistant to oxygen or fluorine than materials of the first underlying layer and the second underlying layer. The first capping layer, the second capping layer and the second underlying layer include a same metal element.

20 Claims, 28 Drawing Sheets

Related U.S. Application Data continuation of application No. 16/836,930, filed on Apr. 1, 2020, now Pat. No. 11,443,979.

(58) Field of Classification Search
CPC ............... H10D 64/664; H10D 64/667; H10D 84/0158; H10D 84/038; H10D 84/834
USPC ........................................................ 257/368
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,443,979 B2 * | 9/2022 | Lee ................... H01L 21/823431 |
| 11,923,240 B2 * | 3/2024 | Lee ................... H01L 21/76802 |

* cited by examiner

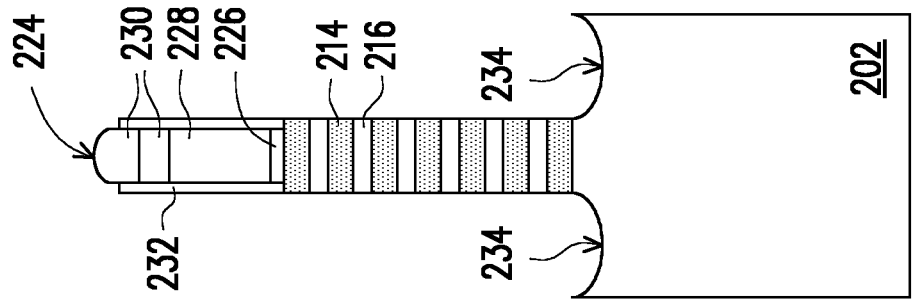
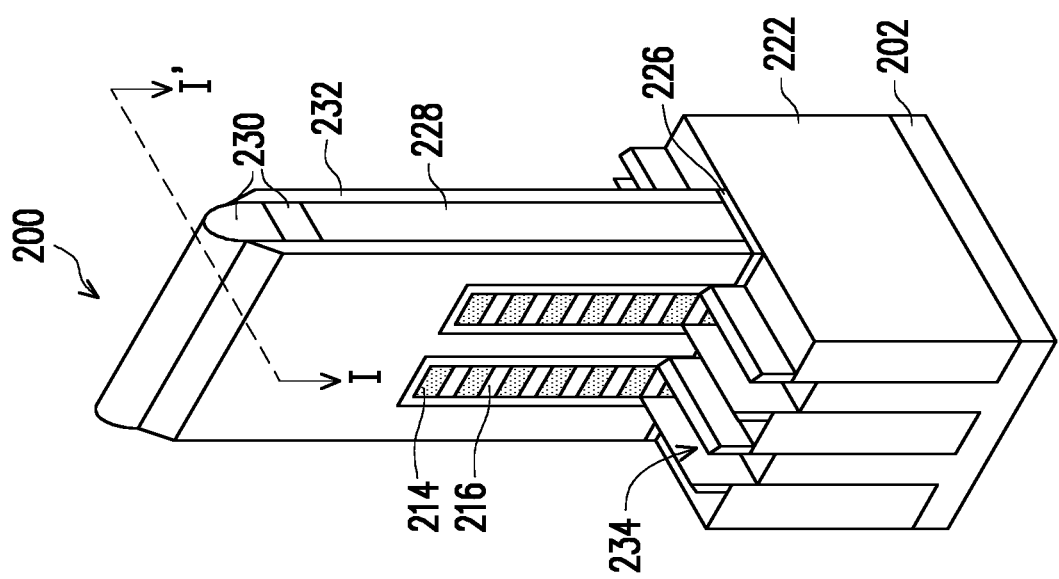
FIG. 12B
FIG. 12A

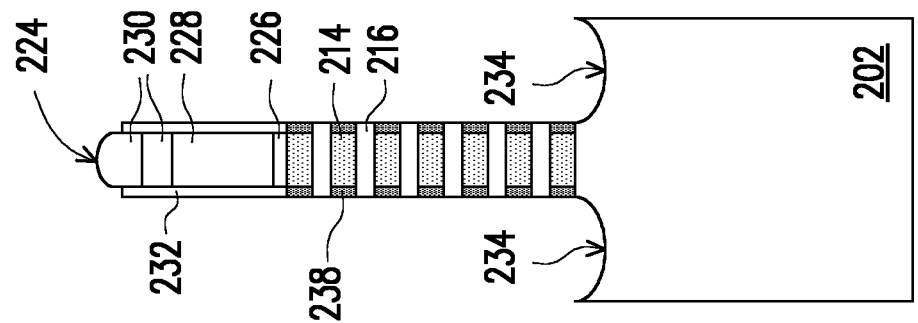
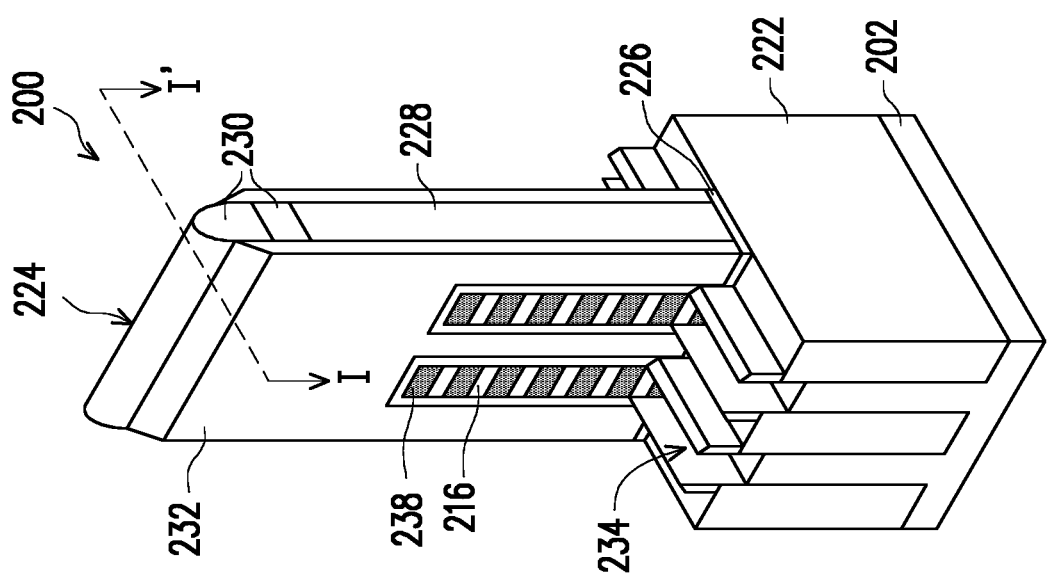
FIG. 14B
FIG. 14A

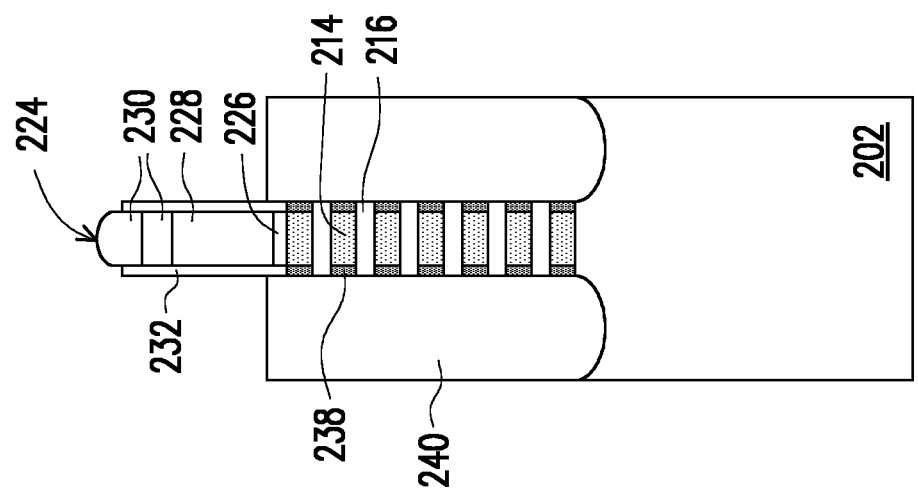
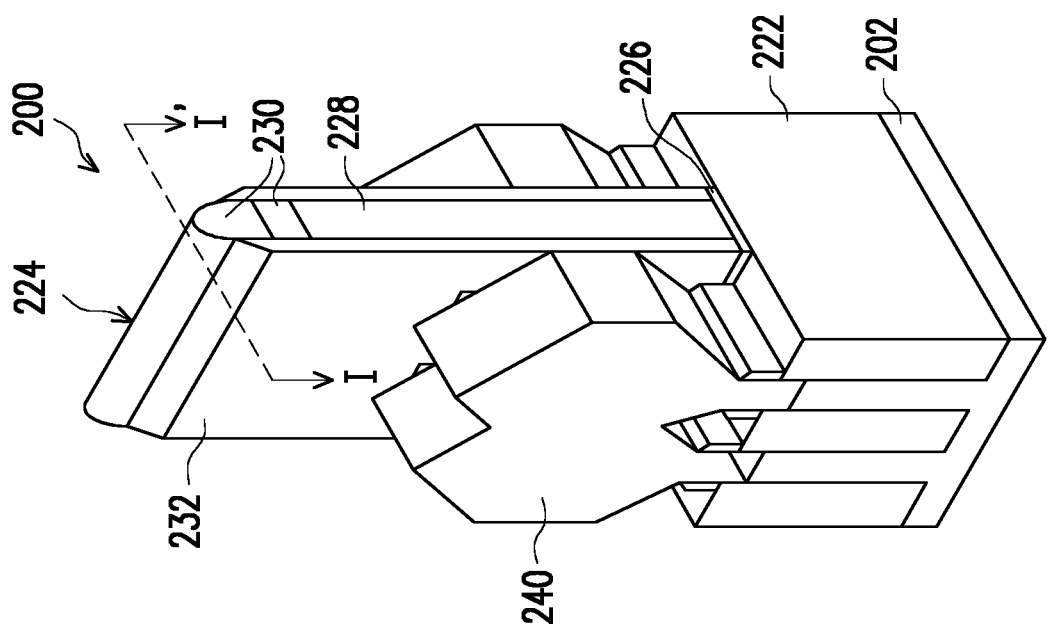
FIG. 15A
FIG. 15B

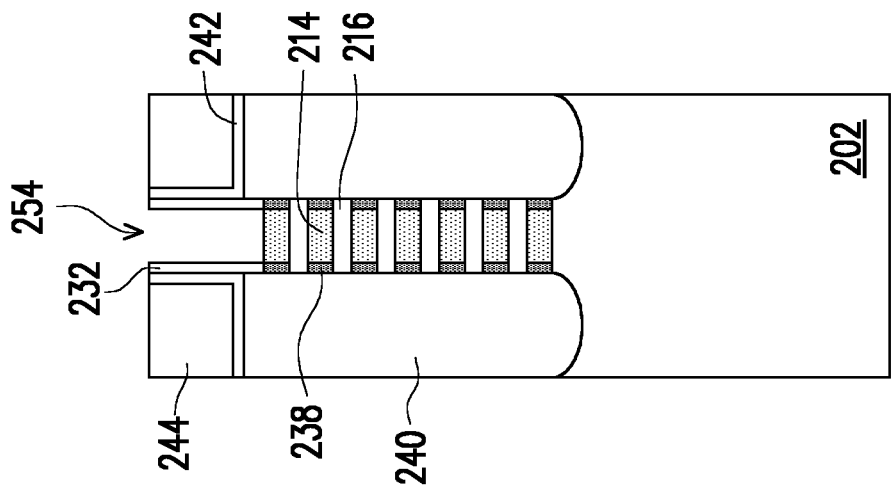
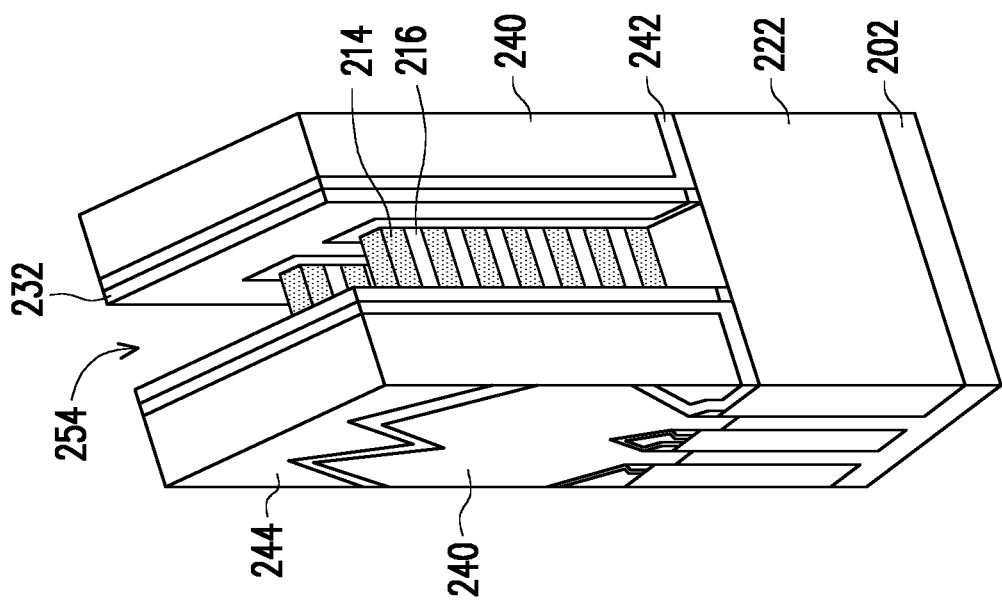
FIG. 18B
FIG. 18A

SEMICONDUCTOR DEVICE

CROSS-REFERENCE TO RELATED APPLICATION

This application is a continuation application of and claims the priority benefit of a prior application Ser. No. 17/874,300, filed on Jul. 27, 2022. The prior application Ser. No. 17/874,300 is a continuation application of and claims the priority benefit of a prior application Ser. No. 16/836,930, filed on Apr. 1, 2020. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6 to 10, and 11A to 20A are diagrammatic perspective views of a semiconductor device at other various stages of fabrication in accordance with some embodiments of the present disclosure.

FIGS. 11B to 20B are fragmentary cross-sectional views along the I-I' line of the semiconductor devices in FIGS. 11A to 20A at other various stages of fabrication in accordance with some embodiments of the present disclosure.

DETAILED DESCRIPTION

Figure 1:
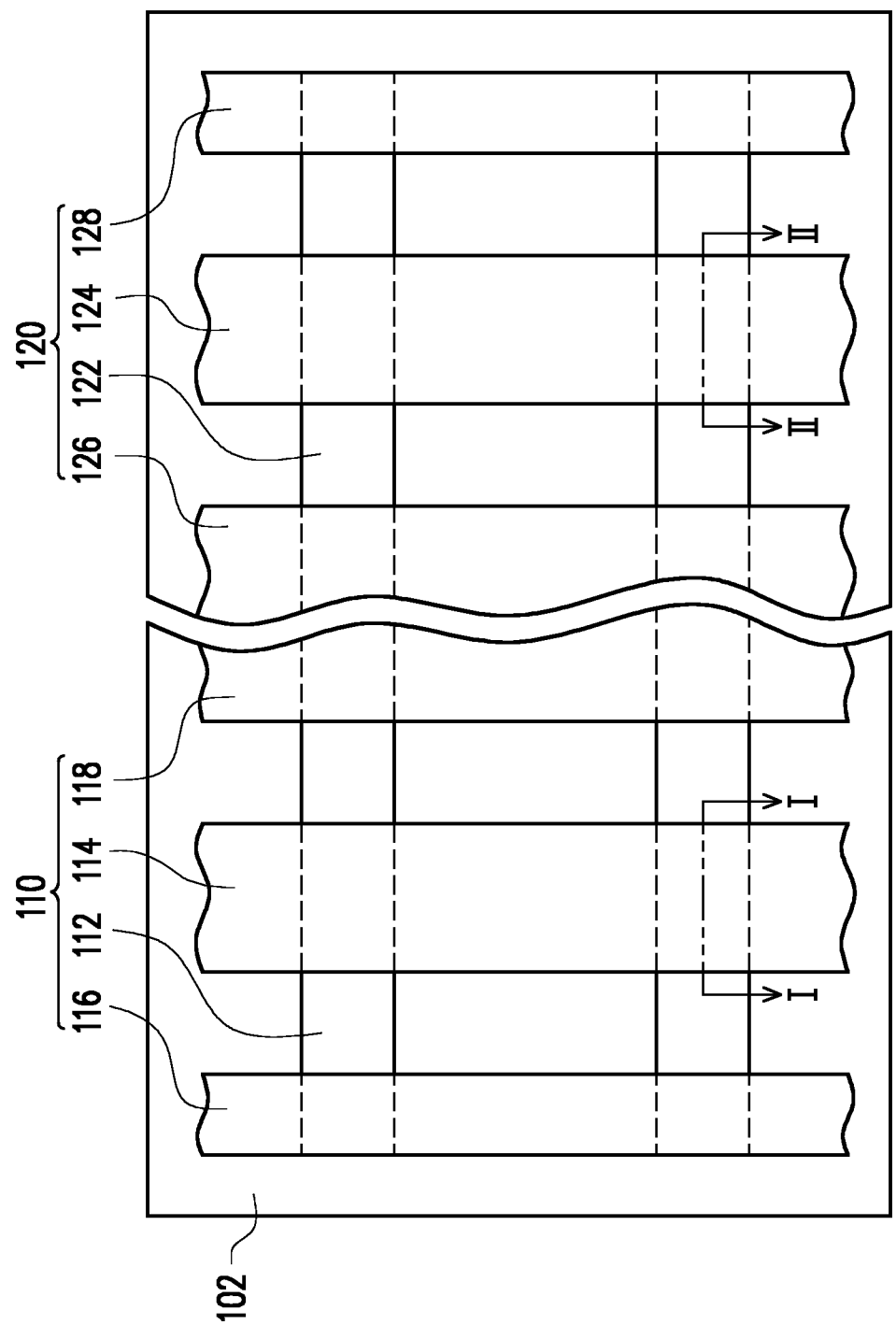
FIG. 1 schematically illustrates a plan view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of p-type and/or n-type devices. One of ordinary skill may recognize other embodiments of semiconductor devices that may benefit from aspects of the present disclosure. For example, some embodiments as described herein may also be applied to the formation of contacts, vias, or interconnects.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

FIG. 1 schematically illustrates a plan view of a semiconductor device in accordance with some embodiments. Referring to FIG. 1, a semiconductor device 100 may include a substrate 102, a first transistor 110, and a second transistor 120. The first transistor 110 and the second transistor 120 are disposed on the substrate 102. In some embodiments, the semiconductor device 100 may be an integrated circuit device typically provided in chip form and may be encapsulated in a package. The semiconductor device 100 may include more than two transistors while the first transistor 110 and the second transistor 120 are illustrated as examples without the intention of limiting the numbers of the transistors in the semiconductor device 100. In the semiconductor device 100, thousands, or more, transistors may be interconnected. In some embodiments, the first transistor 110 and the second transistor 120 may have different device characteristics and thus be able to provide various functions. For example, the first transistor 110 and the second transistor 120 may each be p-type transistor or n-type transistor. In accordance with some embodiments, one or more n-type transistor in the semiconductor device 100 may be interconnected with one or more p-type transistor, for example, by sharing a common gate structure, or may be connected by metal contacts (not shown).

The substrate 102 may be a bulk semiconductor substrate such as a bulk silicon wafer. The term "substrate" may be used to refer to just the semiconductor substrate or a semiconductor substrate inclusive of isolation regions. The substrate 102 may be or include any silicon-containing substrate including, but not limited to, single crystal Si, polycrystalline Si, amorphous Si, or Si-on-insulator (SOI) substrates and the like, and may be n-type or p-type doped as desired for a particular application. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer). The substrate 102 may have one or more fin or fin-like structures for constructing the transistors such as the first transistor 110 and the second transistor 120. The first transistor 110 and the second transistor 120 may be fin type field effect transistors (Fin FETs).

The first transistor 110 may include a first semiconductor fin 112, a first gate structure 114, a first source 116 and a first drain 118. In some embodiments, the first transistor 110 may include two or more first semiconductor fins 112 and each of the first semiconductor fins 112 may be a linear structure on the substrate 102. The first semiconductor fins 112 may be located between neighboring isolation regions in the substrate 102 in some embodiments. The first gate structure 114 is disposed over the first semiconductor fins 112. The first gate structure 114 may extend in a direction intersecting the extending direction of each of the first semiconductor fins 112 and cross through the first semiconductor fins 112. The first source 116 and the first drain 118 are located at two opposite sides of the first gate structure 114, and the first semiconductor fins 112 connect between the first source 116 and the first drain 118.

The second transistor 120 may have a top view structure similar to the first transistor 110. The second transistor 120 may include a second semiconductor fin 122, a second gate structure 124, a second source 126, and a second drain 128. In some embodiments, the second transistor 120 may include two or more second semiconductor fins 122 and each of the second semiconductor fins 122 may be a linear structure on the substrate 102. The second gate structure 124 is disposed over the second semiconductor fins 122. The second gate structure 124 may extend in a direction intersecting the extending direction of each of the second semiconductor fins 122 and cross through the second semiconductor fins 122. The second source 126 and the second drain 128 are located at two opposite sides of the second gate structure 124, and the second semiconductor fins 122 connect between the second source 126 and the second drain 128.

Figure 2:
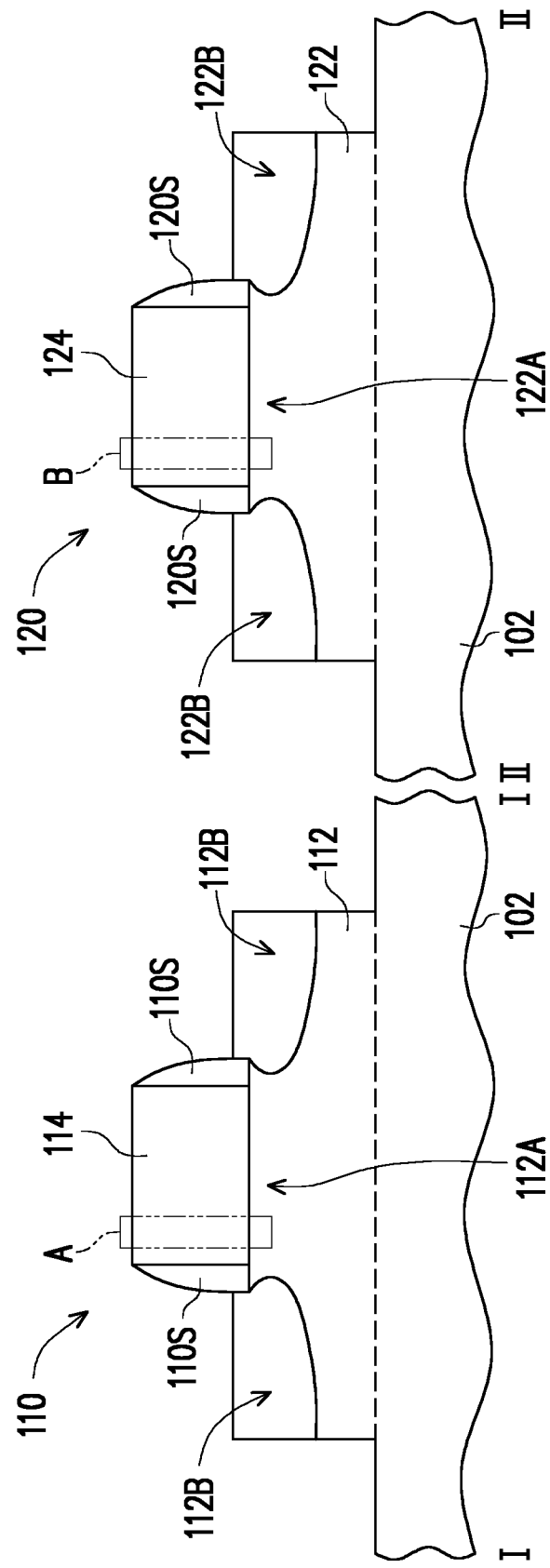
FIG. 2 schematically illustrates a cross-sectional view of a semiconductor device taken along lines I-I and II-II in FIG. 1.

FIG. 2 schematically illustrates a cross-sectional view of a semiconductor device taken along lines I-I and II-II in FIG. 1. Referring to FIG. 2, the first semiconductor fin 112 and the second semiconductor fin 122 may be protruded structures on the substrate 102. A spacer 110S and a spacer 120S may be further disposed on the substrate 102 and formed along sidewalls of first gate structure 114 and the second gate structure 124. The spacer 110S and the spacer 120S each may include one or more layers and may be made of silicon nitride, silicon oxynitride, silicon carbon nitride, the like, multi-layers thereof, or a combination thereof. The spacer 110S is disposed on the first semiconductor fin 112 to define a gate trench on the substrate 102 with the first semiconductor fin 112. The first gate structure 114 is disposed in the gate trench and surrounded by the spacer 110S. Similarly, the spacer 120S may define a gate trench on the second semiconductor fin 122 and the second gate structure 124 may be disposed in the gate trench and surrounded by the spacer 120S.

In some embodiments, the first semiconductor fin 112 may have a channel region 112A. Two doped regions 112B may be formed and located at opposite sides of the channel region 112A. Similarly, in the second transistor 120, the second semiconductor fin 122 may have a channel region 122A and there are two doped regions 122B respectively located at opposite sides of the channel region 122A. The doped regions 112B and 122B may include or be silicon germanium, silicon carbide, silicon phosphorus, pure or substantially pure germanium, a III-V compound semiconductor, a II-VI compound semiconductor, or the like. The doped regions 112B and 122B may be raised in relation to the channel region 112A in some embodiments. The doped regions 112B and 122B may be formed by epitaxial growth, and possibly with implantation, on opposing sides of the respective gate stacks (e.g. the first gate structure 114 and the second gate structure 124). The doped regions 112B and 122B may be doped by in situ doping during the epitaxial growth and/or by implantation after the epitaxial growth.

In some embodiments, the doped regions 112B and the doped regions 122B may include p-type dopant material such as boron, aluminum, gallium, indium, or the like, or n-type dopant material such as phosphorus, arsenic, antimony, bismuth, lithium or the like. In some embodiments, lightly doped source/drain (LDD) regions (not shown) may be respectively disposed between the channel region 112A and the doped regions 112B and between the channel region 122A and the doped regions 122B, while the LDD regions may have a dopant concentration less than the doped regions 112B and 122B. In some embodiments, the dopant material of the doped region 112A and the dopant material of the doped region 122B may be different. In some embodiments, one of the first transistor 110 and the second transistor 120 may be p-type transistor and the other one may be n-type transistor corresponding to the types of the dopant materials in the doped regions 112B and 122B. Or, the first transistor 110 and the second transistor 120 may both be the same type transistors with different threshold voltages.

Figure 3:
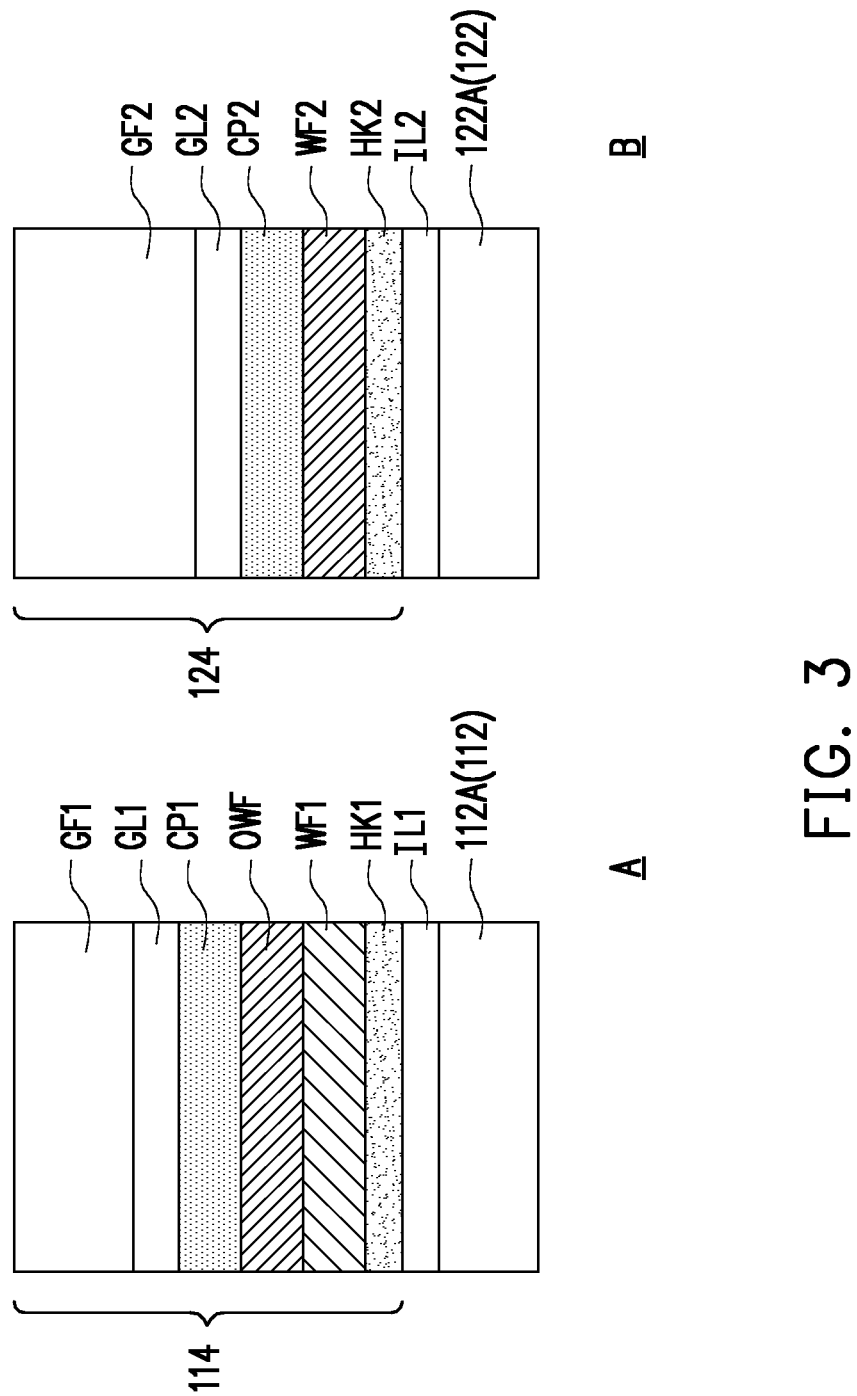
FIG. 3 schematically illustrates enlarged views of the portion A and the portion B in FIG. 2 in accordance with some embodiments.

FIG. 3 schematically illustrates enlarged views of the portion A and the portion B in FIG. 2 in accordance with some embodiments. As shown in FIGS. 2 and 3, the portion A presents an enlarged portion of the first gate structure 114 and the portion B presents an enlarged portion of the second gate structure 124. In the first transistor 110, an insulating layer IL1 is disposed on the channel region 112A and between the first semiconductor fin 112 and the first gate structure 114. Similarly, in the second transistor 120, an insulating layer IL2 is disposed on the channel region 122A and between the second semiconductor fin 122 and the second gate structure 124. The insulating layer IL1 and the insulating layer IL2 may be deposited or thermally grown respectively on the first semiconductor fin 112 and the second semiconductor fin 122 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

In the portion A, the first gate structure 114 may include a first high-k layer HK1, a first work function layer WF1, an overlying work function layer OWF, a first capping layer CP1, a first glue layer GL1, and a first gate fill material GF1 sequentially disposed on the insulating layer IL1 in some embodiments. Each of the first high-k layer HK1, the first work function layer WF1, the overlying work function layer OWF, the first capping layer CP1, the first glue layer GL1 and the first gate fill material GF1 may be deposited and/or formed by using physical vapor deposition (PVD), molecular-beam deposition (MBD), atomic layer deposition (ALD), chemical vapor deposition (CVD), sputtering, or other known processes. In some alternative embodiments, one or more additional work function layers may be disposed between the overlying work function layer OWF and the first capping layer CP1, or between the first capping layer CP1 and the first glue layer GL1 based on various design requirements.

Similarly, in the portion B, the second gate structure 124 is disposed on the insulating layer IL2 and may include a second high-k layer HK2, a second work function layer WF2, a second capping layer CP2, a second glue layer GL2, and a second gate fill material GF2 in some embodiments. The second high-k layer HK2, the second work function layer WF2, the second capping layer CP2, the second glue layer GL2 and the second gate fill material GF2 may be sequentially deposited on the insulating layer IL2. Each of the second high-k layer HK2, the second work function layer WF2, the second capping layer CP2, the second glue layer GL2 and the second gate fill material GF2 may be deposited by using physical vapor deposition (PVD), molecular-beam deposition (MBD), atomic layer deposition (ALD), chemical vapor deposition (CVD), sputtering, or other known processes, depending on the material composition of the layer. In some alternative embodiments, one or more work function layers may be disposed between the second work function layer WF2 and the second capping layer CP2, or between the second capping layer CP2 and the second glue layer GL2 based on various design requirements.

In some embodiments, the first high-k layer HK1 and the second high-k layer HK2 are formed by a common high-k material layer. The formation methods of the common high-k material layer may include molecular-beam deposition (MBD), ALD, PECVD, and the like. The common high-k material layer may have a dielectric constant greater than, for example, about 3.9 (the dielectric constant of silicon dioxide) or greater than about 7.0, and be made of, but not limited to, a metal oxide or a silicate of Hf, Al, Zr, La, Mg, Ba, Ti, Pb, and combinations thereof. Alternatively, the common high-k material layer may include other high-k dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$(STO), $BaTiO_3$(BTO), $BaZrO$, $HfZrO$, $HfLaO$, $HfSiO$, $LaSiO$, $AlSiO$, $HfTaO$, $HfTiO$, $(Ba,Sr)TiO_3$(BST), $Al_2O_3$, $Si_3N_4$, oxynitrides (SiON), combinations thereof, or other suitable material.

The first work function layer WF1 may be on the first high-k layer HK1 in the first gate structure 114, and the overlying work function layer OWF may be disposed on the first work function layer WF1. The second work function layer WF2 may be on the second high-k layer HK2 in the second gate structure 114. A material of the first work function layer WF1 may be different from a material of the second work function layer WF2. A material of the overlying work function layer OWF and the material of the second work function layer WF2 may be the same. In some embodiments, the overlying work function layer OWF and the second work function layer WF2 may be of the same layer.

In some embodiments, during fabrication of the semiconductor device having the first transistor 110 and the second transistor 120, the material layer for forming the first work function layer WF1, such as TiN may be deposited on the substrate 102 to cover the region of the first gate structure 114 and also the region of the second gate structure 124 using atomic layer deposition (ALD) process. Subsequently, the TiN material layer may be patterned by removing the portion of the TiN layer covering on the region of the second gate structure 124. During the patterning process, the portion of the TiN material layer covering the second high-k layer HK2 may be removed until the second high-k layer HK2 is exposed.

Subsequently, the material of the second work function layer WF2 and the overlaying work function layer OWF may be deposited on the exposed second high-k layer HK2 and the first work function layer WF1 using, for example, ALD process. The second work function layer WF2 may be in direct contact with the second high-k layer HK2 and the overlying work function layer OWF may be in direct contact with the first work function layer WF1. In some embodiments, the material of the second work function layer WF2 and the overlaying work function layer OWF may include aluminum such as TiAl, TiAlC, etc. In alternative some embodiments, the material of the second work function layer WF2 and the overlaying work function layer OWF may include aluminum and tantalum. The material of the second work function layer WF2 and the overlaying work function layer OWF may be made of metal or metal carbide such as TaAlC. The effective work function of TiAlC can be tunable from 4.49 eV to 4.79 eV, and the effective work function of TaAlC can be tunable from 4.49 eV to 4.74 eV by adjusting the growth temperature and the film thickness. The effective work function close to Si mid-gap is suitable for low power FinFET device application. When the critical dimension of the device becomes smaller, the work function layer with a smaller threshold voltage (Vt) sensitivity is needed to fine-tune the device Vt. Compared with TiAlC, TaAlC has a smaller Vt tuning sensitivity for film thickness, so TaAlC is very suitable for devices with smaller critical dimension.

In some embodiments in which the second work function layer WF2 and the overlaying work function layer OWF are made of TaAlC, TaAlC may be formed using atomic layer deposition (ALD) process. For example, multiple ALD reaction cycles may be performed, wherein each of the ALD reaction cycles involves consequently performing steps of introducing a reacting gaseous flow including gaseous precursor to the surfaces of the second high-k layer HK2 and the first work function layer WF1, pulsing an inert gas to purge or evacuate the excess gaseous precursor after the surfaces of the second high-k layer HK2 and the first work function layer WF1 are saturated with an atomic layer of the gaseous precursor. A single ALD reaction cycle is continuously repeated until a target thickness for the deposited atomic layer on the surface in process is achieved. In some embodiments, the gaseous precursor includes triethylaluminum (TEA) as the aluminum source, and tantalum pentachloride ($TaCl_5$) as tantalum source.

The first work function WF1 in direct contact with the first high-k layer HK1 and the overlying work function layer OWF stacking on the first work function layer WF1 may together provide the work function tuning effect in the first transistor 110. The second work function layer WF2 in direct contact with the second high-k layer HK2 may provide the work function tuning effect in the second gate structure 124. Since the first transistor 110 and the second transistor 120 include different work function tuning structures, the electricity property of the first transistor 110 and the second transistor 120 may be different. For example, the threshold voltage of the first transistor 110 may be different from that of the second transistor 120. Alternatively, one of the first transistor 110 and the second transistor 120 may be a p-type device while the other is an n-type device. In some embodiments, the first transistor 110 having the first work function layer WF1 and the overlying work function layer OWF may be a p-type device, and the second transistor 120 having the second work function layer WF2 may be an n-type device. In some embodiments, first work function layer WF1 may include metals having a work function substantially aligned with a work function of the substrate valence band, or at least substantially aligned with a work function of the valence band of the channel region 112A of the first transistor 110, and the first transistor 110 may serve as a p-type transistor. The second work function layer WF2 may include metals having a work function substantially aligned with a work function of the substrate conduction band, or at least substantially aligned with a work function of the conduction band of a channel region 122A of the second transistor 120, and the second transistor 120 may serve as an n-type transistor.

In some embodiments, one or more capping layer such as the first capping layer CP1 and the second capping layer CP2 may be disposed on and direct contact with the overlying work function layer OWF and the second work function layer WF2 to protect from oxidations or damages of the overlying work function layer OWF and the second work function layer WF2 during subsequent processing steps. The first capping layer CP1 and the second capping layer CP2 may prevent from the material diffusion from the overlying layers or atmosphere to the overlying work function layer OWF and the second work function layer WF2 so that the overlying work function layer OWF and the second work function layer WF2 may be ensured.

In some embodiments in which the material of the second work function layer WF2 and the overlaying work function layer OWF include aluminum, the material of the first capping layer CP1 and the second capping layer CP2 include aluminum element or tungsten element. The material of the first capping layer CP1 and the second capping layer CP2 may include a metal nitride such as a nitride of aluminum and a nitride of tungsten. In some embodiments, the materials of the first capping layer CP1 and the second capping layer CP2 include nitride, titanium nitride, tantalum nitride, and/or tungsten nitride of aluminum; nitride of tungsten; the like; or a combination thereof. For example, the material of the first capping layer CP1 and the second capping layer CP2 may include aluminum nitride ($Al_xN_y$), titanium aluminum nitride (TiAlN), tantalum aluminum nitride (TaAlN), tungsten aluminum nitride (WAlN), tungsten nitride (WN), or a combination thereof, where 'x' is equal to about 1 to 3; and 'y' is equal to about 1 to 3 The first capping layer CP1 and the second capping layer CP2 may be formed of the same layer and have substantially the same thickness.

In some embodiments, the first capping layer CP1 and the second capping layer CP2 may be formed by in situ depositing after the overlying work function layer OWF and the second work function layer WF2 are formed. The first capping layer CP1 and the second capping layer CP2 may be formed by using, for example, atomic layer deposition (ALD) process. Multiple ALD reaction cycles may be performed, wherein each of the ALD reaction cycles involves consequently performing steps of introducing a reacting gaseous flow including gaseous precursor to the surfaces of the overlying work function layer OWF and the second work function layer WF2, pulsing an inert gas to purge or evacuate the excess gaseous precursor after the surfaces of the overlying work function layer OWF and the second work function layer WF2 are saturated with an atomic layer of the gaseous precursor. A single ALD reaction cycle is continuously repeated until a target thickness for the deposited atomic layer on the surface in process is achieved. In some embodiments in which the first capping layer CP1 and the second capping layer CP2 are made of aluminum nitride ($Al_xN_y$), the gaseous precursor includes trimethylaluminium (TMA) or aluminum chloride ($AlCl_4$) as the aluminum source, and ammonia ($NH_3$) as nitrogen source. The thicknesses of the first capping layer CP1 and the second capping layer CP2 are, for example, in a range of about 5 angstroms to about 30 angstroms.

The first glue layer GL1 is formed on the first capping layer CP1 and the second glue layer GL2 is disposed on the second capping layer CP2. In some embodiments, the first glue layer GL1 and the second glue layer GL2 are formed by in situ depositing after the first capping layer CP1 and the second capping layer CP2 are formed. In alternative some embodiments, the first glue layer GL1 and the second glue layer GL2 are not formed by in situ depositing after the first capping layer CP1 and the second capping layer CP2 are formed. During the vacuum breaking, the surfaces of the second work function layer WF2 and the overlapping work function layer OWF do not exposed and are covered by the first capping layer CP1 and the second capping layer CP2. In some embodiments, the first capping layer CP1 and the second capping layer CP2 may be made of a material presenting higher resistant to oxygen than the second work function layer WF2 and the overlapping work function layer OWF. Therefore, the first capping layer CP1 and the second capping layer CP2 can prevent aluminum of the second work function layer WF2 and the overlapping work function layer OWF from being oxidized. As a result, the metallic-aluminum content loss of the second work function layer WF2 and the overlapping work function layer OWF can be reduced, and the flat-band voltage ($V_{FB}$) can be shifted toward the n-band edge, thereby reducing the threshold voltage of the n-type transistor. In some embodiments, the aluminum content of the second work function layer WF2 and the overlapping work function layer OWF ranges from about 5 atom % to about 30 atom %.

The first glue layer GL1 and the second glue layer GL2 may be formed by a common glue layer and the material of the first glue layer GL1 and the second glue layer GL2 may include TiN or similar material. In some embodiments, the material of the first glue layer GL1 and the second glue layer GL2 may have desirable affinity to the material of the first gate fill material GF1 and the second gate fill material GF2, such that the first gate fill material GF1 and the second gate fill material GF2 may be firmly adhered to the first glue layer GL1 and the second glue layer GL2, respectively. The first gate fill material GF1 and the second gate fill material GF2 disposed on the first glue layer GL1 and the second glue layer GL2 may be formed by the same layer of a gate fill material such as W, TiN, TaN, WN, Re, Ir, Ru, Mo, Al, Cu, Co, Ni, combinations thereof, and/or other suitable compositions. In some embodiments in which the first gate fill material GF1 and the second gate fill material GF2 are formed of W, W is deposited by CVD using $WF_6$ and He as a reacting gaseous. The first capping layer CP1 and the second capping layer CP2 may prevent from the material diffusion from fluorine from $WF_6$ diffusing into the overlying work function layer OWF and the second work function layer WF2.

Figure 4A:
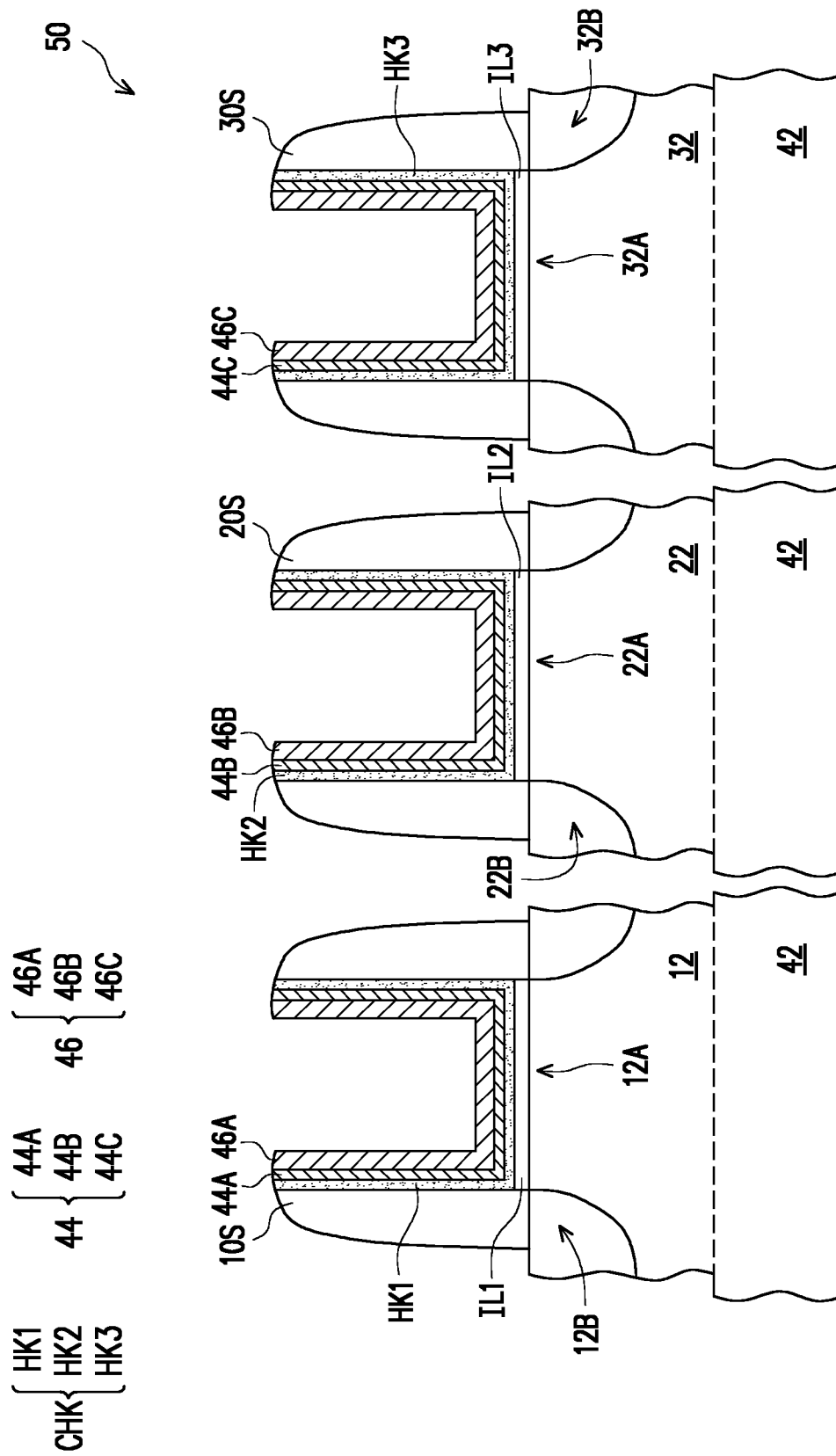
FIGS. 4A to 4F schematically illustrate a method of fabricating a semiconductor device in accordance with some embodiments.
Figure 4B:
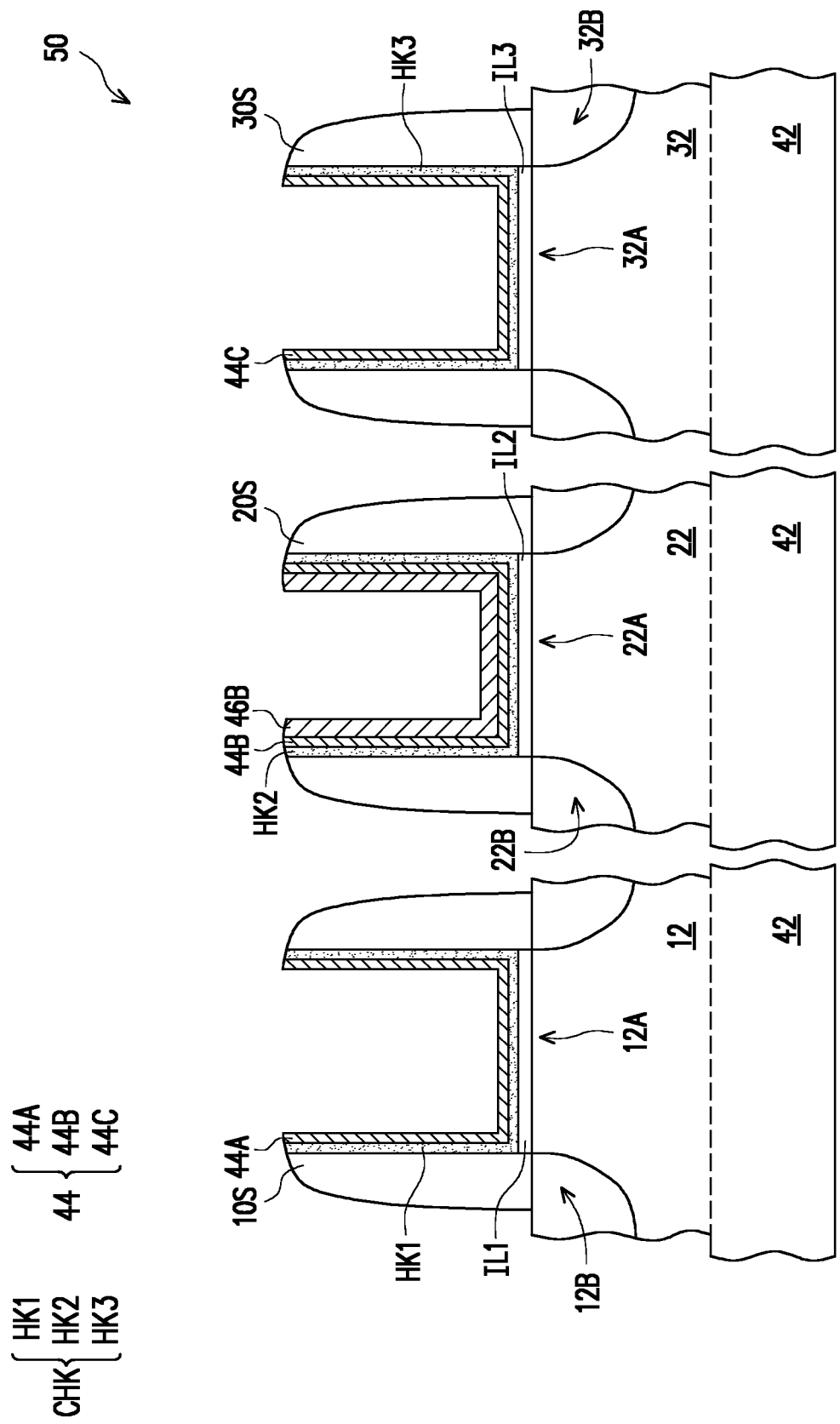
Figure 4C:
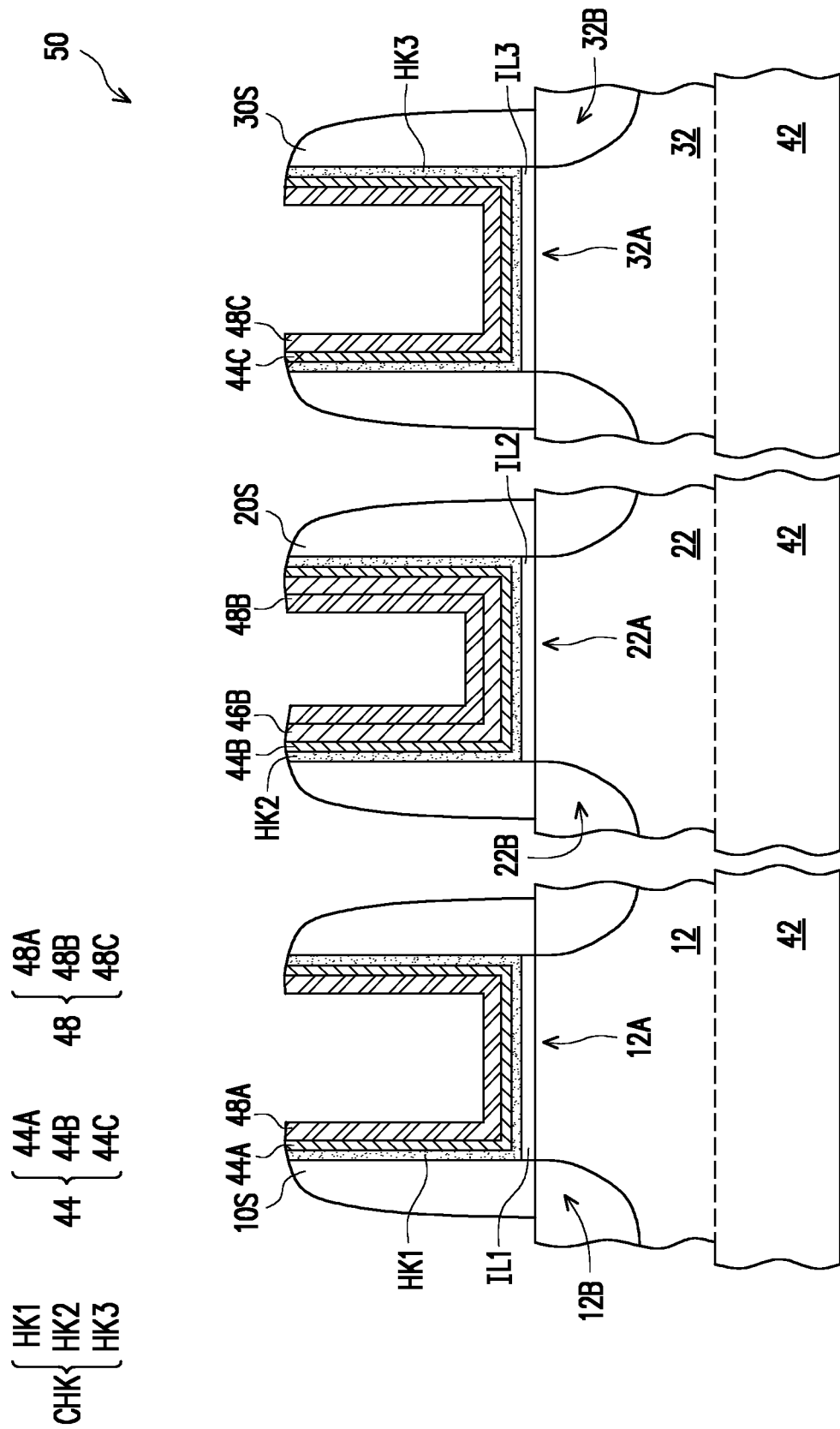
Figure 4D:
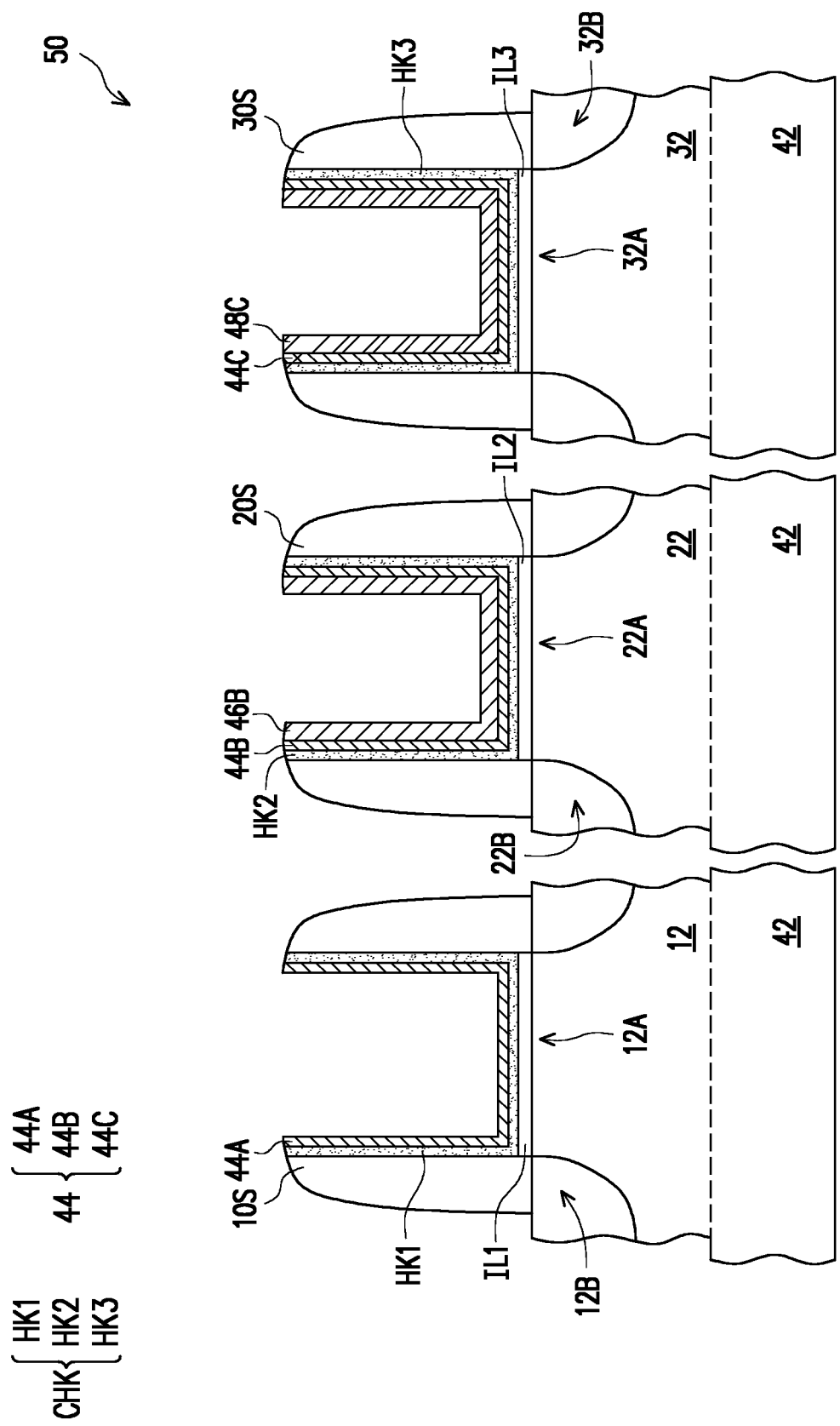
Figure 4E:
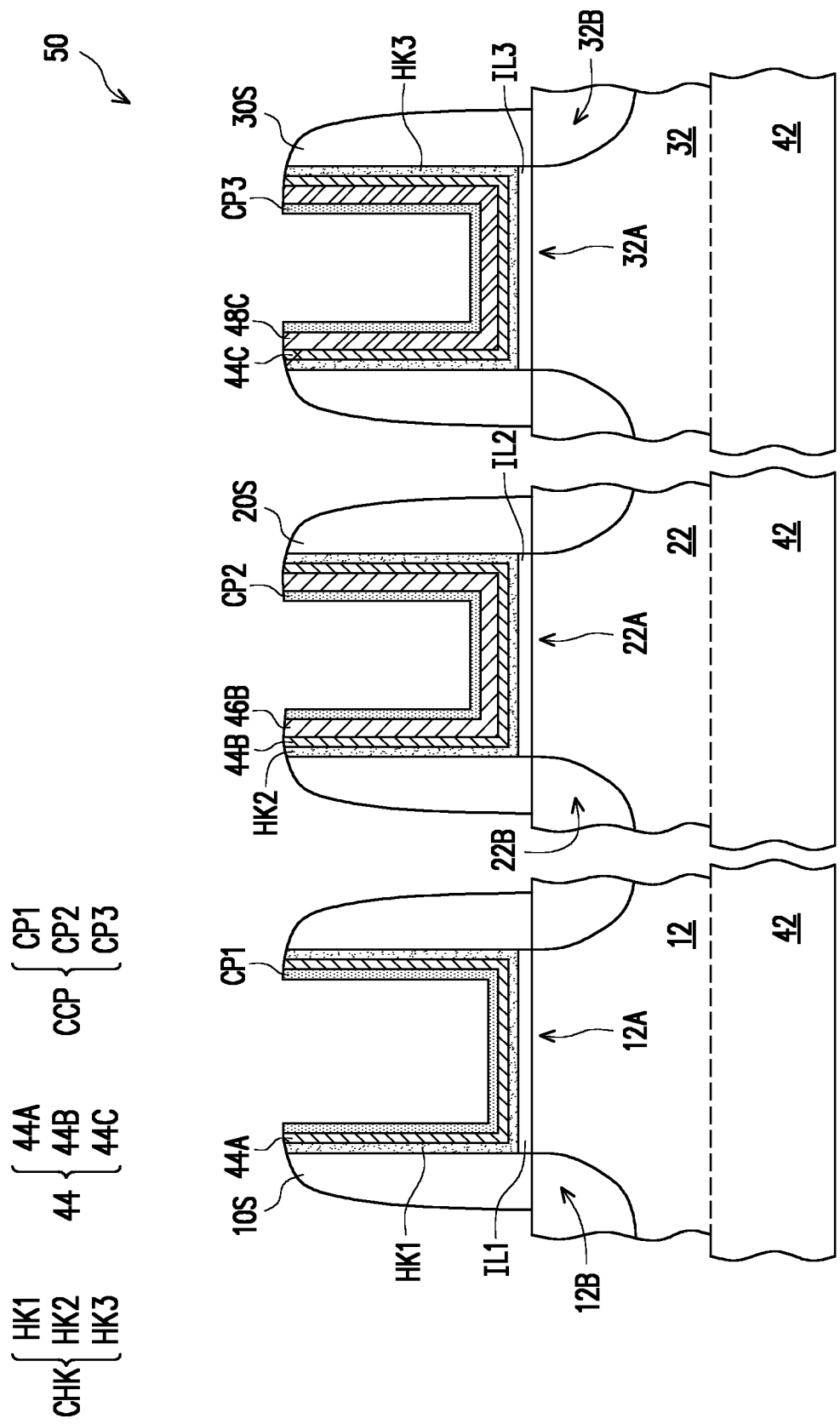
Figure 4F:
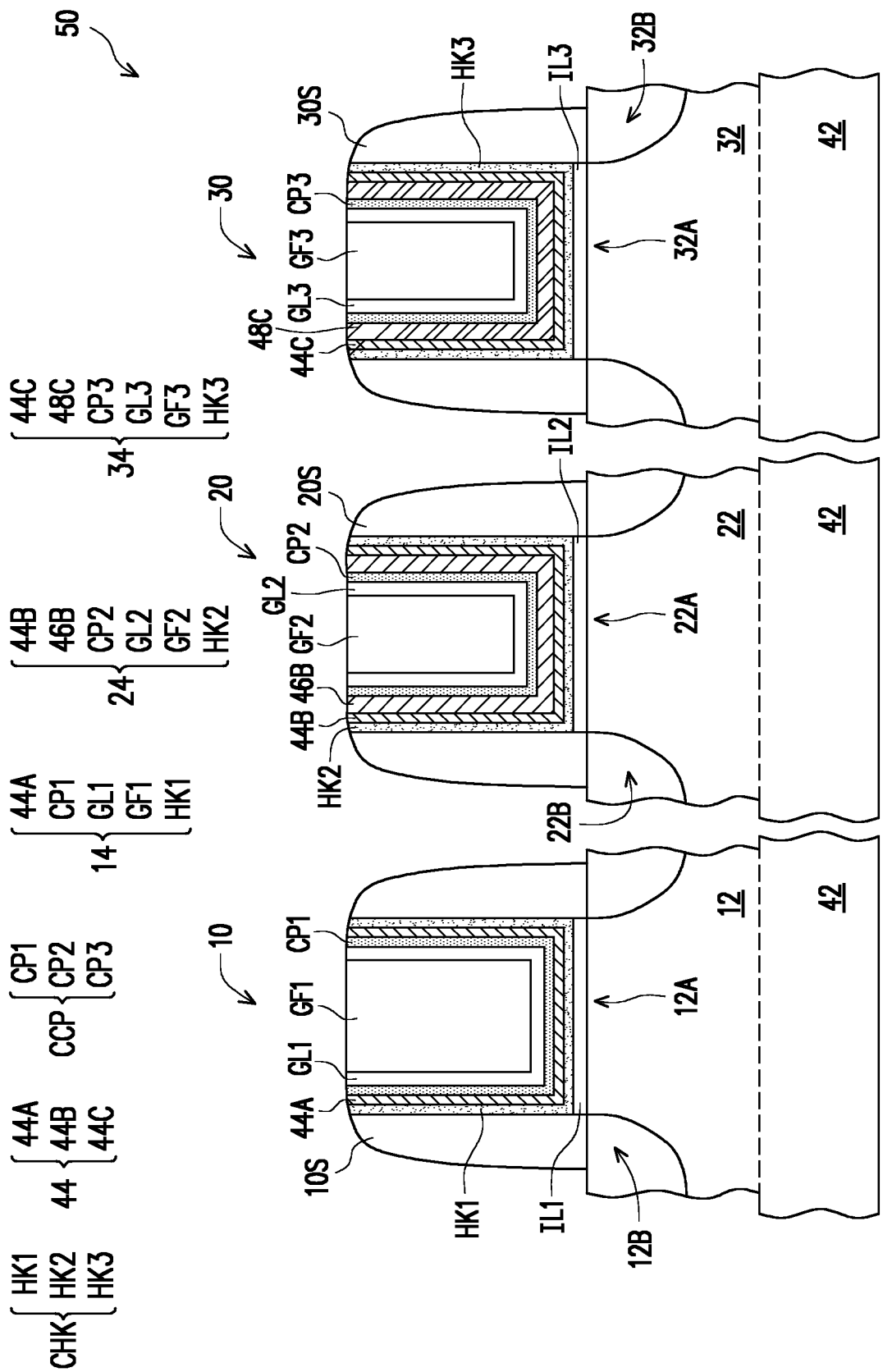
Figure 5:
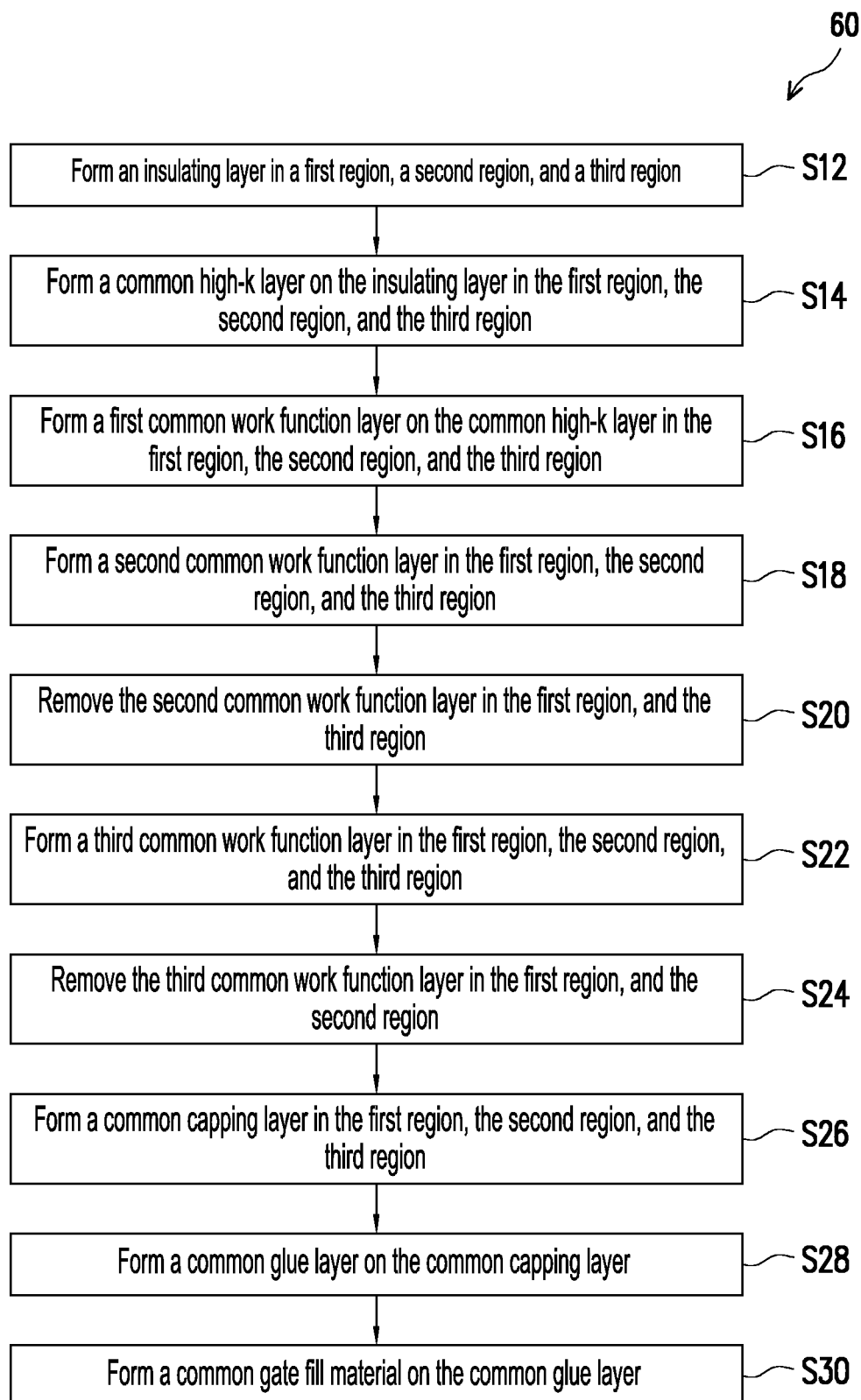
FIG. 5 illustrates a flow chart of a method of fabricating a semiconductor device in accordance with some embodiments of the present disclosure.

FIG. 5 illustrates a flow chart of a method 60 of fabricating a semiconductor device 50 in accordance with some embodiments of the present disclosure. FIG. 5 will be described below in conjunction with FIGS. 4A to 4F. FIGS. 4A to 4F schematically illustrate a method of fabricating a semiconductor device 50 at other various stages of fabrication in accordance with some embodiments of the present disclosure of the method 60.

In FIG. 4A, semiconductor fins 12, 22, and 32 are formed on a substrate 42 and the substrate 42 is commonly shared by the semiconductor fins 12, 22, and 32. Each of the semiconductor fins 12, 22, and 32 may have a linear structure in the top view, which is similar to the top view structures of the first and second semiconductor fins 12 and 22 shown in FIG. 1. The semiconductor fin 12 may have a channel region 12A. Two doped regions 12B may be formed and located at opposite sides of the channel region 12A. The semiconductor fin 22 may have a channel region 22A interposed between two doped regions 22B, and the semiconductor fin 32 may have a channel region 32A sandwiched between two doped regions 32B.

At operation S12, the method 60 (FIG. 5) forms an insulating layer IL1 on the channel region 12A of the semiconductor fin 12, an insulating layer IL2 on the channel region 22A of the semiconductor fin 22, and an insulating layer IL3 on the channel region 32A of the semiconductor fin 32, as shown in FIG. 4A. In some embodiments, a spacer 10S may be formed on the semiconductor fin 12 to form a gate trench over the semiconductor fin 12, a spacer 20S may be formed on the semiconductor fin 22 to form a gate trench over the semiconductor fin 22, and a spacer 30S may be formed on the semiconductor fin 32 to form a gate trench over the semiconductor fin 32. In some embodiments, the material of the insulating layer IL1, the insulating layer IL2 and the insulating layer IL3 may include silicon oxide and/or silicon oxynitride and may be formed by chemical oxidation, thermal oxidation, atomic layer deposition (ALD), chemical vapor deposition (CVD), and/or alternative suitable methods.

At operation S14, the method 60 (FIG. 5) forms a common high-k layer CHK on the substrate 42 by using, for example, physical vapor deposition (PVD), atomic layer deposition (ALD), chemical vapor deposition (CVD), sputtering, or other known processes as shown in FIG. 4A. The common high-k layer CHK may have a dielectric constant greater than, for example, about 2.9 (the dielectric constant of silicon dioxide) or about 7.0. In some examples, the material of the common high-k layer CHK includes hafnium oxide ($HfO_2$). Alternatively, the material of the common high-k layer CHK may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, (Ba,Sr)$TiO_3$(BST), $Al_2O_3$, $Si_3N_4$, oxynitrides (SiON), combinations thereof, or other suitable material. A portion of the common high-k layer CHK covers the gate trench of the spacer 10S in a conformed manner to serve as a first high-k layer HK1, a portion of the common high-k layer CHK covers the gate trench of the spacer 20S in a conformed manner to serve as a second high-k layer HK2, and a portion of the common high-k layer CHK covers the gate trench of the spacer 30S in a conformed manner to serve as a third high-k layer HK3. In some embodiments, the first high-k layer HK1, the second high-k layer HK2 and the third high-k layer HK3 are formed of the same layer, the common high-k layer CHK, and may have the same material and the same thickness.

At operation S16, the method 60 (FIG. 5) forms common work function layer 44 on the common high-k layer CHK, as shown in FIG. 4A. The material of the common work function layer 44 may include Ti or Ta. The common work function layer 44 may include a portion 44A covering the first high-k layer HK1, a portion 44B covering the second high-k layer HK2, and a portion 44C covering the third high-k layer HK3. In some embodiments, the work function of the common work function layer 44 may have a work function substantially aligned with a work function of the substrate valence band, or at least substantially aligned with a work function of the valence band of the channel region 12A.

At operation S18, the method 60 (FIG. 5) forms a second common work function layer 46 on the substrate 42, as shown in FIG. 4A. The common work function layer 46 may include Al. The common work function layers 46 and 44 have different materials. The material of the common work function layer 46 may include at least one selected from TiAl, TiAlC, TaC, TaAlC, NbC, and VC. In some embodiments, the material of the common work function layer 46 may include TaAlC. The common work function layer 46 includes portions 46A, 46B and 46C covering the portions 44A, 44B and 44C of the common work function layer 44, respectively. In some embodiments, the work function of the common work function layer 46 may have a work function substantially aligned with a work function of the substrate valence band, or at least substantially aligned with a work function of the valence band of the channel region 22A. The previously formed common work function layer 44 may, but not limit thereto, have a work function greater than the common work function layer 46.

At operation S20, the method 60 (FIG. 5) patterns the common work function layer 46 by removing the portions 46A and 46C, as shown in FIG. 4B. The portion 46B of the common work function layer 46 may remain on the portion 44B of the common work function layer 44. The process of patterning the common work function layer 46 may include photolithography and etching. In some embodiments, the Cl-based or F-based etchant including $TiCl_x$, $TaCl_x$, $TiF_x$, $HfCl_x$, $WF_x$ or $WCl_x$, where 'x' is equal to about 1-6 may be used for removing the portions 46A and 46C of the common work function layer 46. The process of patterning the common work function layer 46 may include removing the portions 46A and 46C of the common work function layer 46 until the portion 44A and 44C of the common work function layer 44 are exposed, for example, using $WCl_5$ as the etchant.

At operation S22, the method 60 (FIG. 5) forms a third work function layer 48 on the substrate 42 by, for example, physical vapor deposition (PVD), atomic layer deposition (ALD), chemical vapor deposition (CVD), sputtering, or other known processes, as shown in FIG. 4C. The common work function layer 48 may include Al. The material of the common work function layer 46 may include at least one selected from TiAl, TiAlC, TaC, TaAlC, NbC, and VC. In some embodiments in which the common work function layer 46 include TaAlC, the material of the common work function layer 48 include TiAlC. In some embodiments, the material of the common work function layer 48 may include metals having a work function substantially aligned with a work function of the substrate conduction band, or at least substantially aligned with a work function of the conduction band of a channel region 32A. The previously formed common work function layers 44 and 46 may, but not limit thereto, have a work function greater than the common work function layer 48. In some embodiments, the common work function layer 44 may have a characteristic similar to p-type work function layer and the common work function layers 46 and 48 may have a characteristic similar to n-type work function layer, but is not limited thereto.

At operation S24, the method 60 (FIG. 5) patterns the common work function layer 48 by removing the portions 48A and 48B, as shown in FIG. 4D. The portion 48C of the common work function layer 48 may remain on the portion 44C of the common work function layer 44, respectively. The process of patterning the common work function layer 48 may include photolithography and etching. In some embodiments, the Cl-based or F-based etchant including $TiCl_x$, $TaCl_x$, $TiF_x$, $HfCl_x$, $WF_x$ or $WCl_x$, where 'x' is equal to about 1-6, may be used for removing the portions 48A and 48B of the common work function layer 48.

At operation S26, the method 60 (FIG. 5) forms a common capping layer CCP by depositing a high resistant material, as shown in FIG. 4E. The material of the common capping layer CCP may include aluminum element or tungsten element. In some embodiments, the material of the common capping layer CCP may include a metal nitride such as a nitride of aluminum and a nitride of tungsten. In some embodiments, the material of the common capping layer CCP includes nitride, titanium nitride, tantalum nitride, and/or tungsten nitride of aluminum; nitride of tungsten; the like; or a combination thereof. For example, the material of the common capping layer CCP may include aluminum nitride ($Al_xN_y$), titanium aluminum nitride (TiAlN), tantalum aluminum nitride (TaAlN), tungsten aluminum nitride (WAlN); tungsten nitride (WN), or the like, where 'x' is equal to about 1 to 3; and 'y' is equal to about 1 to 3.

A portion of the common capping layer CCP covering the portion 44A of the common work function layer 44 forms a first capping layer CP1, a portion of the common capping layer CCP covering the portion 46B of the common work function layer 46 forms a second capping layer CP2, and a portion of the common capping layer CCP covering the portion 48C of the common work function layer 48 forms a third capping layer CP3. The first capping layer CP1, the second capping layer CP2 and the third capping layer CP3 may be of the same layer, have the same material and have the same thickness.

At operations S28 and S30, the method 60 (FIG. 5) forms a common glue layer and a common gate fill material on the substrate 42, as shown in FIG. 4F. The common glue layer may include a first glue layer GL1 covering the first capping layer CP1, a second glue layer GL2 covering the second capping layer CP2, and a third glue layer GL3 covering the third capping layer CP3. The first glue layer GL1, the second glue layer GL2 and the third glue layer GL3 may be formed to define gate trenches corresponding to the spaces 10S, 20S and 30S, respectively. The common gate fill material may form a first gate fill material GF1 filling the gate trench defined by the first glue layer GL1, a second gate fill material GF2 filling the gate trench defined by the second glue layer GL2, and a third gate fill material GF3 filling the gate trench defined by the third glue layer GL3. Subsequently, a planarization process such as chemical mechanical polishing (CMP) process may be performed to remove extra material to form individual gate structures 14, 24 and 34 respectively over the semiconductor fin 12, the semiconductor fin 22 and the semiconductor fin 32.

Referring to FIG. 4F, in the first gate structure 14, the portion 44A of the common work function layer 44 covering the first high-k layer HK1 may serve as a first work function layer WF1. The first gate structure 14 may include the first high-k layer HK1, the first work function layer WF1, the first capping layer CP1, the first glue layer GL1 and the first gate fill material GF1. The first high-k layer HK1, the first work function layer WF1, the first capping layer CP1, the first glue layer GL1 and the first gate fill material GF1 may form a common top surface for contacting with another conductive material or another component.

The portion 46B of the common work function layer 46 and the portion 44B of the common work function layer 44 covering the second high-k layer HK2 forms a second work function layer WF2 of the second gate structure 24. The second gate structure 24 may include the second high-k layer HK2, the second work function layer WF2, the second capping layer CP2, the second glue layer GL2 and the second gate fill material GF2. The second high-k layer HK2, the second work function layer WF2, the second capping layer CP2, the second glue layer GL2 and the second gate fill material GF2 may form a common top surface for contacting with another conductive material or another component. The common work function layer 46 and the common work function layer 44 may be made of different materials so as to determine and tune the threshold voltage of the transistor 20 having the second gate structure 24. The second work function layer WF2 serves to determine and tune the threshold voltage of the transistor 20 having the second gate structure 24. Since the work function of the second work function layer WF2 is different from the first work function layer WF1, the transistor 10 having the first gate structure 14 and the transistor 20 having the second gate structure 24 may have different threshold voltages to achieve a multi-Vt (threshold voltage) design.

The portion 48C of the common work function layer 48 and the portion 44C of the common work function layer 44 covering the third high-k layer HK3 forms a third work function layer WF3 of the third gate structure 34. The gate structure 34 may include the third high-k layer HK3, the third work function layer WF3, the third capping layer CP3, the third glue layer GL3 and the third gate fill material GF3. The third high-k layer HK3, the third work function layer WF3, the third capping layer CP3, the third glue layer GL3 and the third gate fill material GF3 may form a common top surface for contacting with another conductive material or another component. The work function of the thick third work function layer WF3 may be different from that of the second work function layer WF2 so that the second gate structure 24 and the third gate structure 34 may be adopted to form the transistors with different threshold voltages so as to achieve a multi-Vt design.

The first gate structure 14, the second gate structure 24 and the third gate structure 34 respectively disposed over the semiconductor fin 12, the semiconductor fin 22 and the semiconductor fin 32 may construct transistors 10, 20 and 30 of the semiconductor devices 50. The first gate structure 14, the second gate structure 24 and the third gate structure 34 may have different work function tuning design so that the transistors 10, 20 and 30 may have different threshold voltages so facilitate the application of multi functions semiconductor device.

Figure 21A:
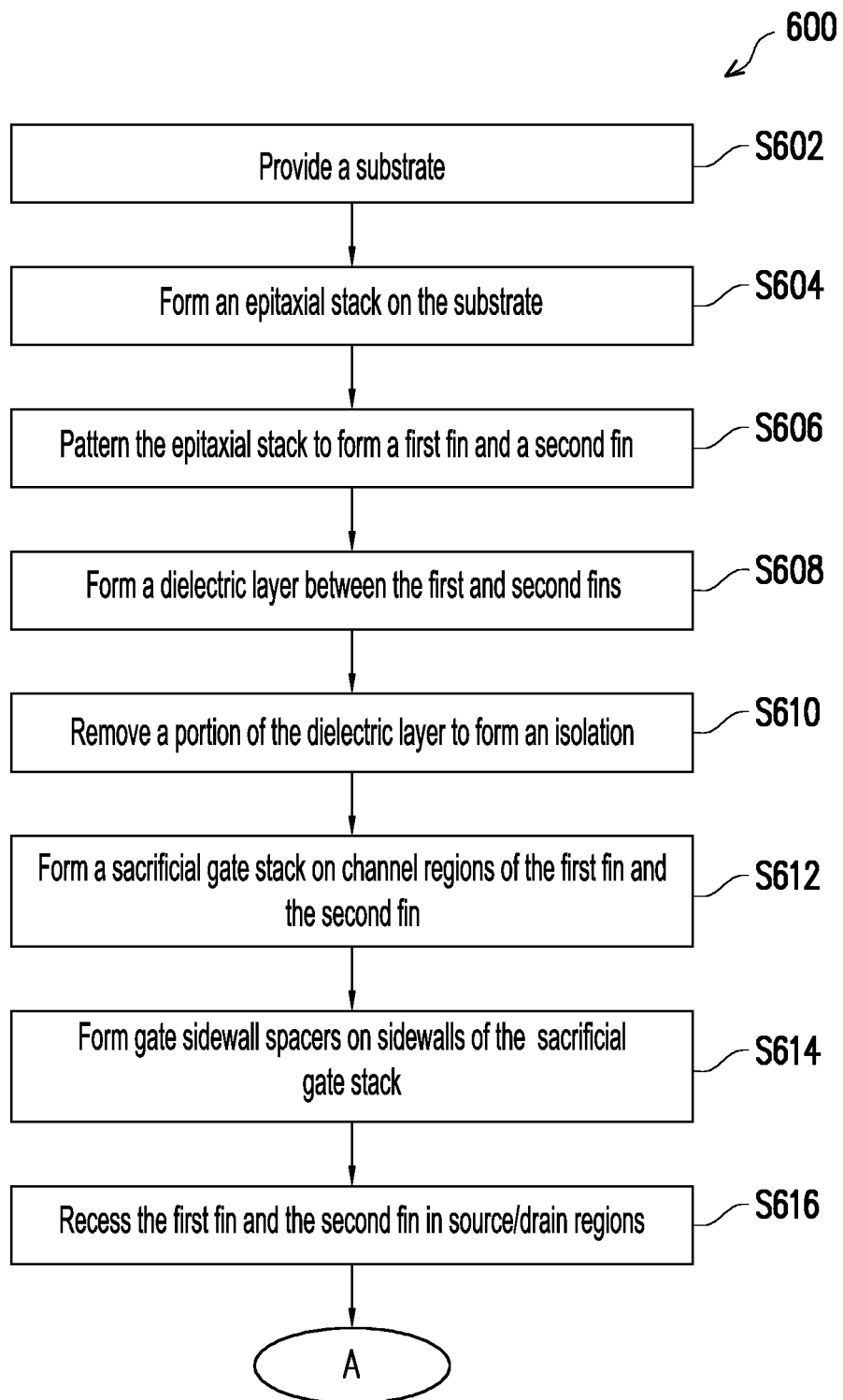
FIGS. 21A and 21B illustrate a flow chart of a method for forming multi-gate devices according to various aspects of the present disclosure.
Figure 21B:
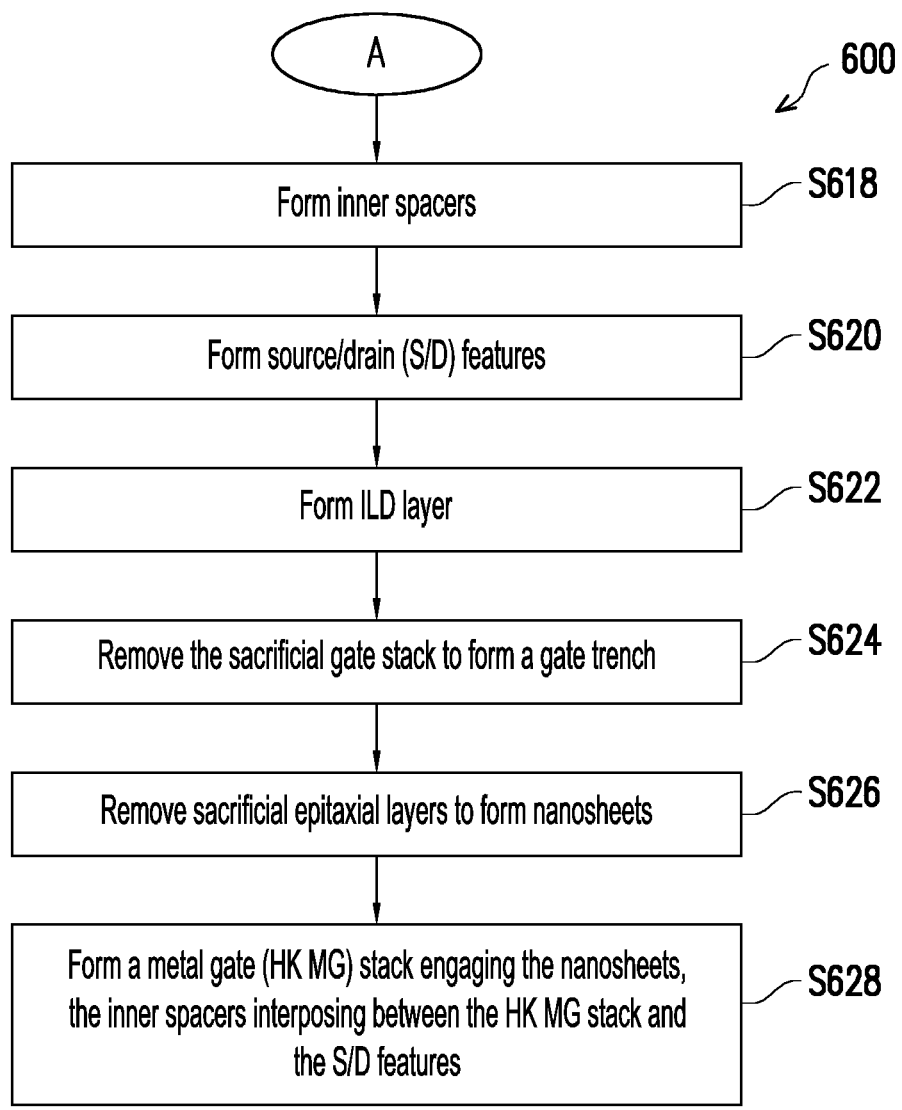
Figure 21C:
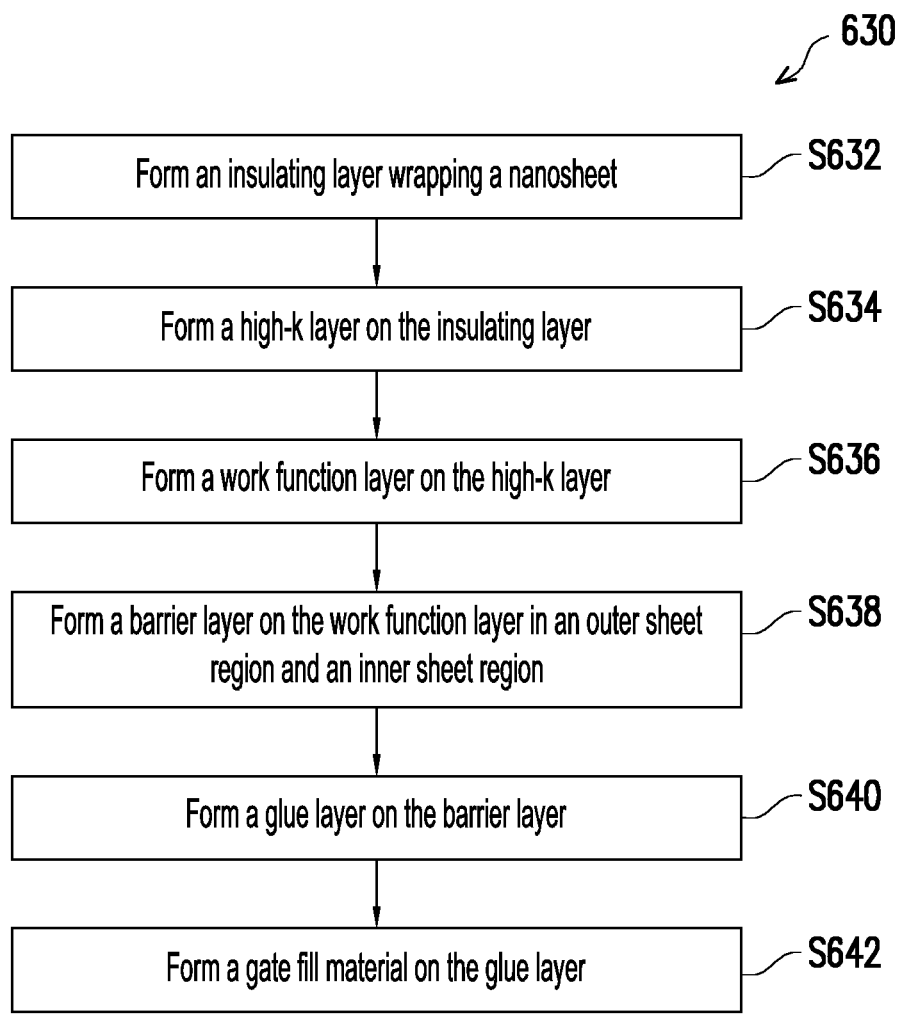
FIG. 21C illustrate a flow chart of a method for forming a metal gate structure according to various aspects of the present disclosure.

FIGS. 21A and 21B illustrate a flow chart of a method 600 for forming multi-gate devices according to various aspects of the present disclosure. FIG. 21C illustrate a flow chart of a method 630 for forming a metal gate structure of an operation S628 of the method 600 in FIG. 21B. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nanosheet" or "semiconductor nanosheet," which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

Figure 19C:
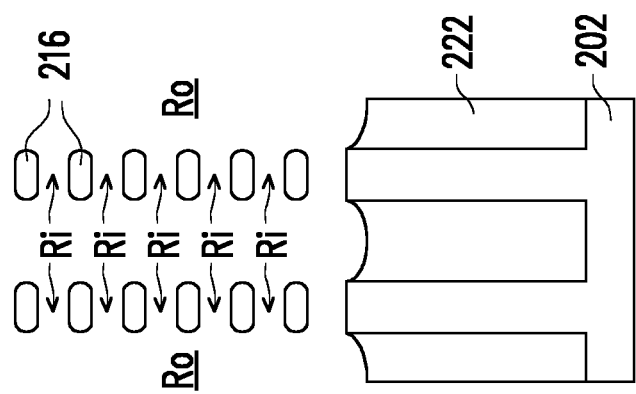
FIGS. 19C and 20C are fragmentary cross-sectional views along the II-II' line of the semiconductor devices in FIGS. 19A and 20A at other various stages of fabrication in accordance with some embodiments of the present disclosure.

FIGS. 21A, 21B, and 21C will be described below in conjunction with FIGS. 6 to 20E. FIGS. 6 to 10, and 11A to 20A are diagrammatic perspective views of a semiconductor device 200 at other various stages of fabrication in accordance with some embodiments of the present disclosure of the method 600. FIGS. 11B to 20B are fragmentary cross-sectional views along the I-I' line of the semiconductor devices 200 in FIGS. 11A to 20A at other various stages of fabrication in accordance with some embodiments of the present disclosure of the method 600. FIGS. 19C and 20C are fragmentary cross-sectional views along the II-II' line of the semiconductor devices 200 in FIGS. 19A and 20A at other various stages of fabrication in accordance with some embodiments of the present disclosure of the method 600. FIGS. 20D and 20E are fragmentary cross-sectional views along the III-III' line and IV-IV' of the semiconductor devices 200 in FIG. 20B at other various stages of fabrication in accordance with some embodiments of the present disclosure of the method 600. FIGS. 20A to 20E are diagrammatic perspective view and fragmentary cross-sectional views at other various stages of fabrication a metal gate structure in accordance with some embodiments of the present disclosure of the method 630. The method 600 or 630 is merely an example, and is not intended to limit the present disclosure beyond what is explicitly recited in the claims. Additional steps may be provided before, during, and after method 600 or 630, and some of the steps described can be moved, replaced, or eliminated for additional embodiments of method 600 or 630. Additional features may be added in the semiconductor device depicted in FIGS. 6 to 20E and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of methods 600 and 630, including any descriptions given with reference to FIGS. 6 to 20E, as with the remainder of the method and exemplary figures provided in this disclosure, are merely exemplary and are not intended to be limiting beyond what is specifically recited in the claims that follow.

Figure 6:
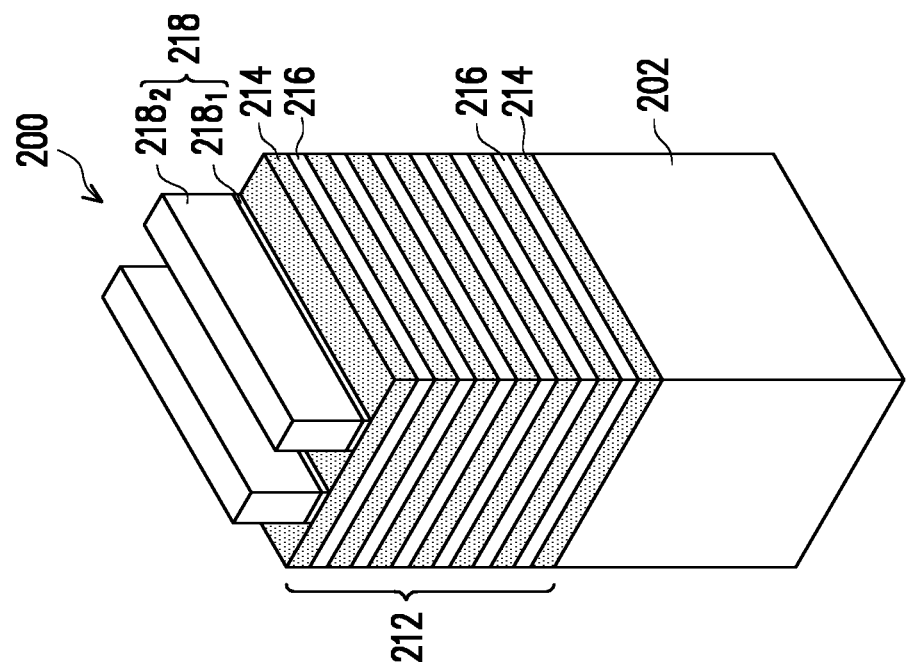

At operation S602, the method 600 (FIG. 21A) provides a substrate 202, as shown in FIG. 6. In some embodiments, the substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. For example, different doping profiles (e.g., p-well, n-well) may be formed on the substrate 202 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. In the illustrated embodiment, the substrate 202 is made of crystalline Si.

At operation S604, the method 600 (FIG. 21A) forms one or more epitaxial layers over the substrate 202, as shown in FIG. 6. In some embodiments, an epitaxial stack 212 is formed over the substrate 202. The epitaxial stack 212 includes epitaxial layers 214 of a first composition interposed by epitaxial layers 216 of a second composition. The first and second composition may be different. In an embodiment, the epitaxial layers 214 are SiGe and the epitaxial layers 216 are silicon. However, other embodiments are possible including those that provide for a first composition and a second composition having different oxidation rates and/or etch selectivity. In some embodiments, the epitaxial layer 214 includes SiGe and where the epitaxial layer 216 includes silicon, the silicon oxidation rate is less than the SiGe oxidation rate. It is noted that five (5) layers of epitaxial layers 214 and four (4) layers of epitaxial layers 216 are illustrated in FIG. 6, which is for illustrative purposes only and not intended to be limiting beyond what is specifically recited in the claims. It can be appreciated that any number of epitaxial layers may be formed in the epitaxial stack 212; the number of layers depending on the desired number of channels regions for the device 200. In some embodiments, the number of epitaxial layers 216 is between 2 and 10, such as 6 or 7.

In some embodiments, the epitaxial layer 214 has a thickness ranging from about 5 nm to about 15 nm. The epitaxial layers 214 may be substantially uniform in thickness. In some embodiments, the epitaxial layer 216 has a thickness ranging from about 5 nm to about 15 nm. In some embodiments, the epitaxial layers 216 of the stack are substantially uniform in thickness. As described in more detail below, the epitaxial layer 216 may serve as channel region(s) for a subsequently-formed multi-gate device and its thickness chosen based on device performance considerations. The epitaxial layer 214 may serve to define a gap between adjacent channel region(s) for a subsequently-formed multi-gate device and its thickness chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 216 include the same material as the substrate 202. In some embodiments, the epitaxially grown layers 214 and 216 include a different material than the substrate 202. As stated above, in at least some examples, the epitaxial layer 214 includes an epitaxially grown $Si_{1-x}Ge_x$ layer (e.g., x is about 10~55%) and the epitaxial layer 216 includes an epitaxially grown silicon (Si) layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation, etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. In the illustrated embodiment, the bottom layer and the top layer of the epitaxial stack 212 are SiGe layers. In alternative embodiments, the bottom layer of the epitaxial stack 212 is a Si layer and the top layer of the epitaxial stack 212 is a SiGe layer (not shown).

Figure 7:
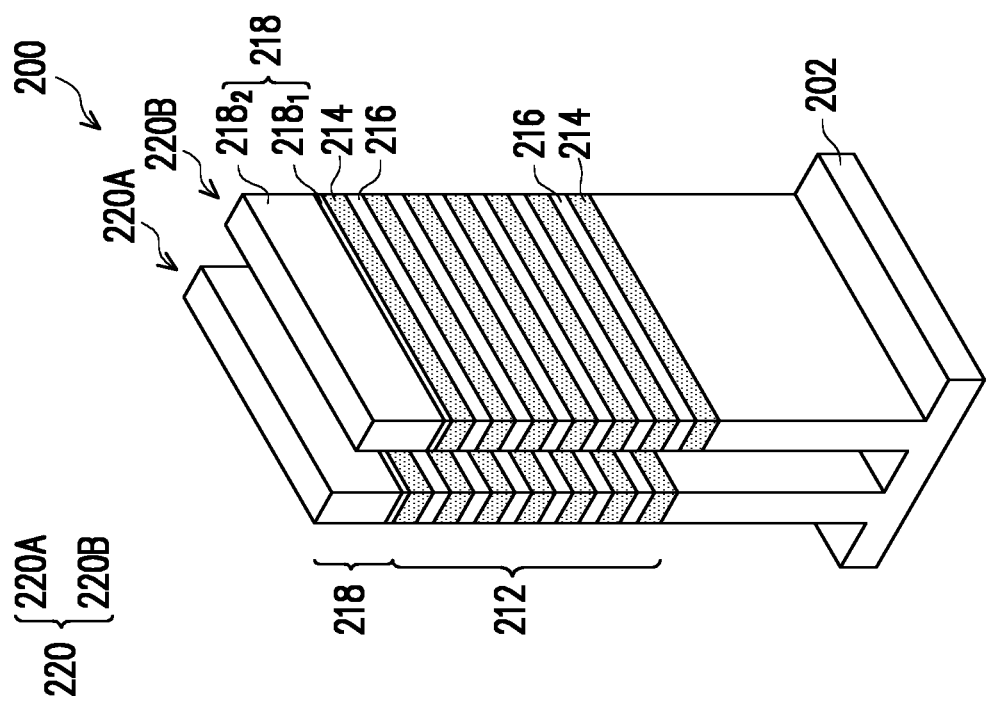

At operation S606, the method 600 (FIG. 21A) patterns the epitaxial stack 212 to form semiconductor fins 220 (also referred to as fins 220), as shown in FIGS. 6 and 7. In various embodiments, each of the fins 220 includes an upper portion of the interleaved epitaxial layers 214 and 216, and a bottom portion protruding from the substrate 202. In some embodiments, the operation S606 includes forming a mask layer 218 over the epitaxial stack 212. The mask layer 218 includes a first mask layer 221 and a second mask layer $218_2$. The first mask layer 221 is a pad oxide layer made of a silicon oxide, which may be formed by a thermal oxidation. The second mask layer $218_2$ is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 218 is patterned into a mask pattern by using patterning operations including photolithography and etching.

Operation S606 subsequently patterns the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into the fins 220 with trenches between adjacent fins 220. The fins 220 may include a fin 220A and a fin 220B having a same width or different widths. Each of the fins 220 protrudes upwardly in the z-direction from the substrate 202 and extends lengthwise in the y-direction. Sidewalls of the fins 220 may be straight or inclined (not shown). In FIG. 7, two fins 220 (including one fin 220A and one fin 220B) are spaced apart along the x-direction. But the number of the fins is not limited to two, and may be as small as one or more than two.

At operation S608, the method 600 (FIG. 21A) fills trenches between adjacent fins 220 with a dielectric layer 222 to cover top surfaces and sidewalls of the fins 220. The dielectric layer 222 may include one or more dielectric materials. Suitable dielectric materials for the dielectric layer 222 may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques.

Figure 9:
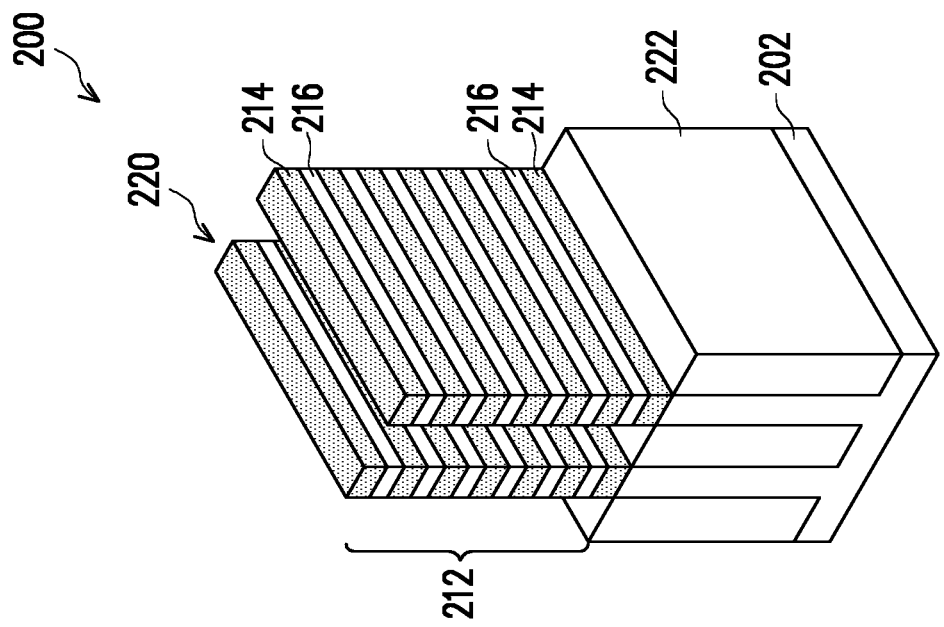
Figure 8:
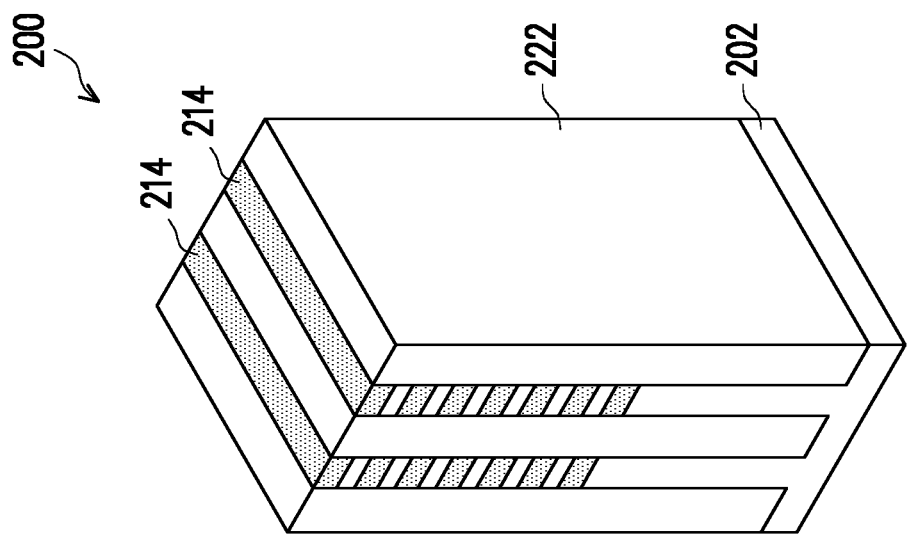

Operation S610 subsequently planarizes the dielectric layer 222 by using, for example, CMP, until top surfaces of the mask layer 218 are revealed, and recesses the dielectric layer 222 to form shallow trench isolation (STI) features (also denoted as STI features 222), as shown in FIGS. 8 and 9. In the illustrated embodiment, the STI features 222 are formed on the substrate 202. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220. The mask layer 218 (shown in FIG. 7) may also be removed before, during, and/or after the recessing of the isolation features 222. In some embodiments, the mask layer 218 is removed by the CMP process performed prior to the recessing of the isolation features 222. In some embodiments, the mask layer 218 is removed by an etchant used to recess the isolation features 222.

Figure 10:
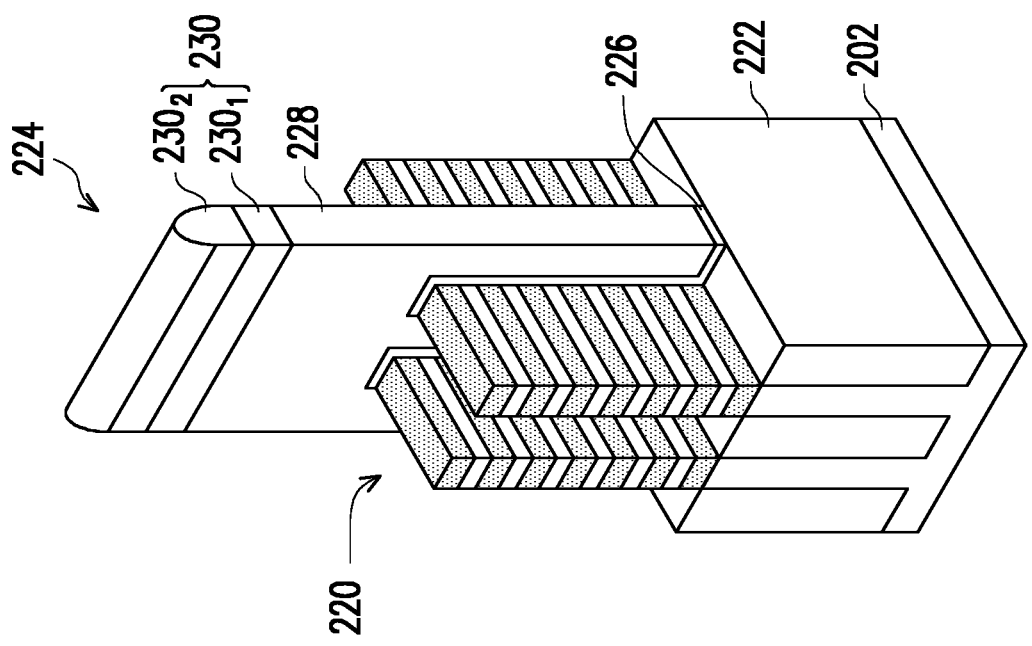

At operation S612, the method 600 (FIG. 21A) forms a sacrificial (dummy) gate structure 224, as shown in FIG. 10. The sacrificial gate structures 224 are formed over portions of the fins 220 which are to be channel regions. The sacrificial gate structures 224 define the channel regions of the GAA devices. Each of the sacrificial gate structures 224 includes a sacrificial gate dielectric layer 226 and a sacrificial gate electrode layer 228 over the sacrificial gate dielectric layer 226. The sacrificial gate structures 224 are formed by first blanket depositing the sacrificial gate dielectric layer 226 over the fins 220. A sacrificial gate electrode layer 228 is then blanket deposited on the sacrificial gate dielectric layer 226 and over the fins 220. The sacrificial gate electrode layer 228 includes silicon such as polycrystalline silicon or amorphous silicon. The thickness of the sacrificial gate dielectric layer 226 is in a range from about 1 nm to about 5 nm in some embodiments. The thickness of the sacrificial gate electrode layer 228 is in a range from about 100 nm to about 200 nm in some embodiments. In some embodiments, the sacrificial gate electrode layer 228 is subjected to a planarization operation. The sacrificial gate dielectric layer 226 and the sacrificial gate electrode layer 228 are deposited using CVD, including LPCVD and PECVD, PVD, ALD, or other suitable process. A mask layer 230 is formed over the sacrificial gate electrode layer. The mask layer 230 may include a mask layer $230_1$ such as silicon oxide and a mask layer $230_2$ such as silicon nitride. Subsequently, a patterning operation is performed on the mask layer 230 and sacrificial gate dielectric and electrode layers are patterned into the sacrificial gate structures 224. By patterning the sacrificial gate structures 224, the fins 220 are partially exposed on opposite sides of the sacrificial gate structures 224, thereby defining source/drain (S/D) regions. In this disclosure, a source and a drain are interchangeably used and the structures thereof are substantially the same.

Figure 11B:
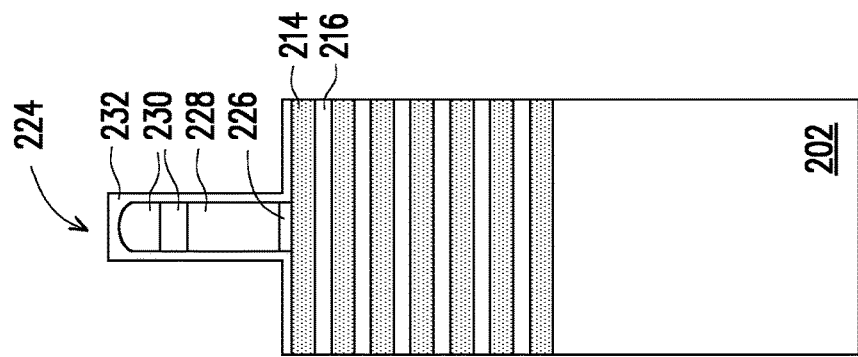
Figure 11A:
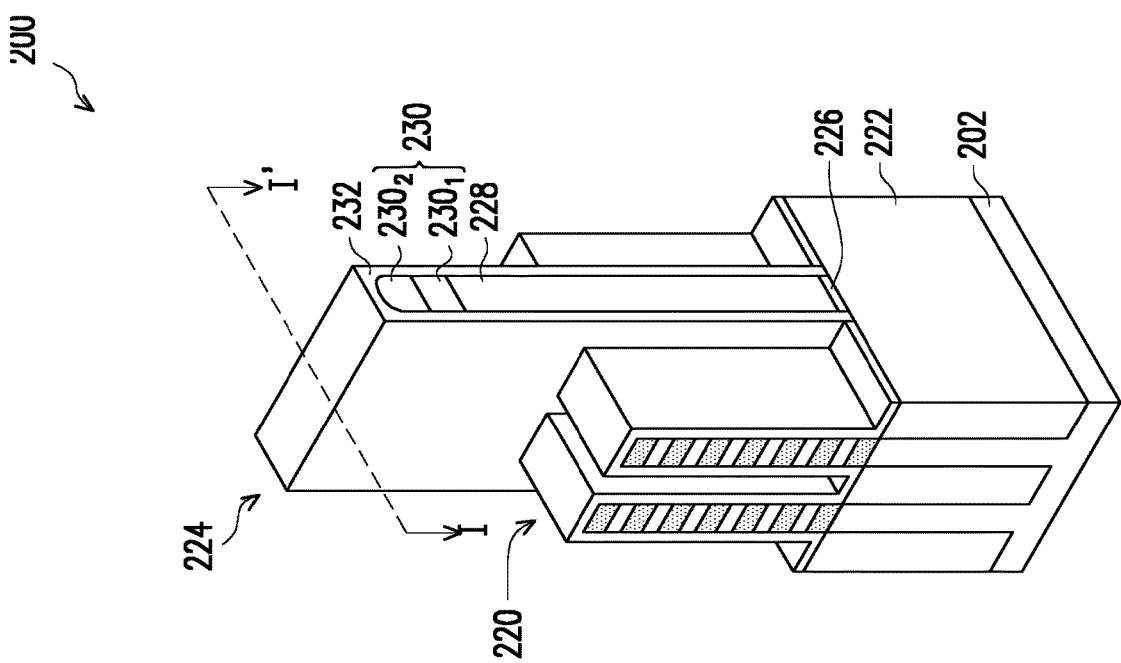

At operation S614, the method 600 (FIG. 21A) forms spacers 232 on sidewalls of the sacrificial gate structure 224 and sidewalls of the fins 220 by depositing spacer material 232 and followed by an etching, as shown in FIGS. 11A, 11B, 12A and 12B, where FIGS. 11B and 12B are cross-sectional views along I-I' lines of the devices 200 in FIGS. 11A and 12A, respectively. In some embodiments, the spacers 232 are referred to as gate sidewall spacers. The spacers 232 may include spacer material such as silicon oxide, silicon nitride, silicon carbide, silicon oxynitride, SiCN films, silicon oxycarbide, SiOCN films, and/or combinations thereof. In some embodiments, the spacers 232 include multiple layers, such as liner layers and main spacer walls. By way of example, the spacers 232 may be formed by depositing spacer material 232 (shown in FIGS. 11A and 11B) including a liner material layer and a dielectric material layer over the sacrificial gate structure 224 using processes such as, a subatmospheric CVD (SACVD) process, a flowable CVD process, an ALD process, a PVD process, or other suitable process respectively. The deposition of the liner material layer and the dielectric material layer are followed by an etching-back (e.g., anisotropically) process to expose portions of the fins adjacent to and not covered by the sacrificial gate structure 224 (e.g., S/D regions), as shown in FIGS. 12A and 12B. The liner material layer and the dielectric material layer may remain on the sidewalls of the sacrificial gate structure 224 as gate sidewall spacers, and on the sidewalls of the fins as fin sidewall spacers. In some embodiments, the etching-back process may include a wet etch process, a dry etch process, a multiple-step etch process, and/or a combination thereof. The spacers 232 may have a thickness ranging from about 5 nm to about 20 nm.

At operation S616, the method 600 (FIG. 21A) recesses a portion of the fins 220 to form recesses 234 in the S/D regions as shown in FIGS. 12A and 12B, where FIG. 12B is a cross-sectional view along I-I' line of the device 200 in FIG. 12A. The stacked epitaxial layers 214 and 216 are etched down at the S/D regions. In many embodiments, the operation S614 forms the recesses 234 by a suitable etching process, such as a dry etching process, a wet etching process, or an RIE process.

Figure 13B:
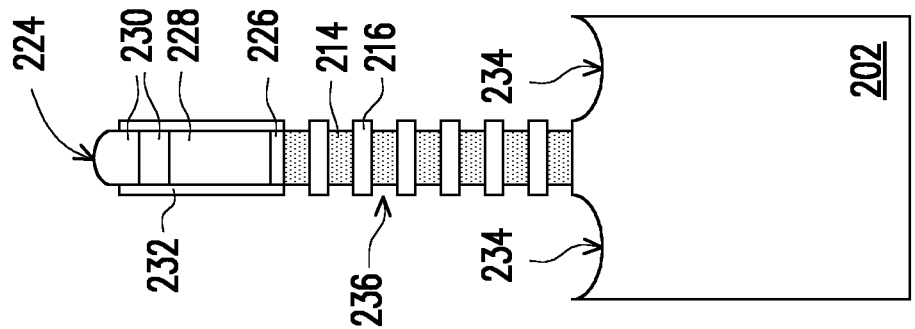
Figure 13A:
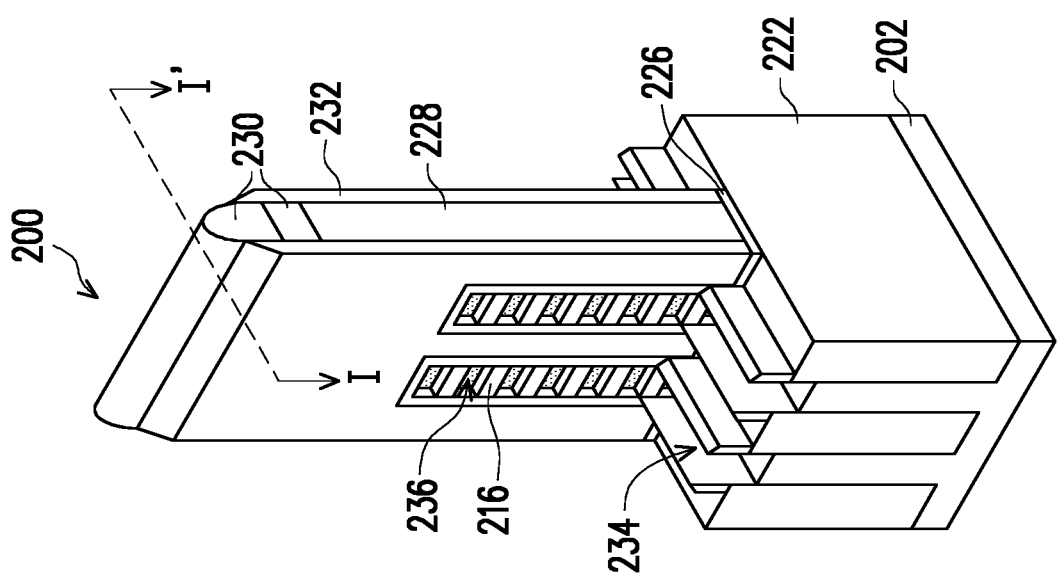

At operation S618, the method 600 (FIG. 21B) forms inner spacers directly under the gate sidewall spacers 232. In some embodiments, the operation S616 first laterally etches the epitaxial layers 214 in the y-direction, thereby forming cavities 236, as shown in FIGS. 13A and 13B, where FIG. 13B is a cross-sectional view along I-I' line of the device 200 in FIG. 13A. The amount of etching of the epitaxial layers 214 is in a range from about 1 nm to about 4 nm in some embodiments. The epitaxial layers 214 may be selectively etched by using a wet etchant such as, but not limited to, ammonium hydroxide ($NH_4OH$), tetramethylammonium hydroxide (TMAH), ethylenediamine pyrocatechol (EDP), potassium hydroxide (KOH), HF, $O_3$, $H_2O_2$, or HCl solutions. Alternatively, the operation S616 may first selectively oxidize lateral ends of the epitaxial layers 214 that are exposed in the recesses 234 to increase the etch selectivity between the epitaxial layers 214 and 216. In some examples, the oxidation process may be performed by exposing the device 200 to a wet oxidation process, a dry oxidation process, or a combination thereof.

Subsequently, operation S616 forms an inner spacer material layer 238 on the lateral ends of the epitaxial layer 214, on the epitaxial layers 216 and in cavities 236 and the recesses 234, as shown in FIGS. 14A and 14B, where FIG. 14B is a cross-sectional view along I-I' line of the device 200 in FIG. 14A. The inner spacer material layer 238 may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238 may be formed by ALD or any other suitable method. By conformally forming the inner spacer material layer 238, the size of the cavity 234 is reduced or the cavity 234 is completely filled. The inner spacer material layer 238 may have a thickness ranging from about 4 nm to about 6 nm, for example.

At operation S620, the method 600 (FIG. 21B) forms epitaxial S/D features 240, as shown in FIGS. 15A and 12B, where FIG. 15B is a cross-sectional view along I-I' line of the device 200 in FIG. 15A. In some embodiments, the epitaxial S/D features 240 include silicon for an n-type FET and SiGe for a p-type FET. The epitaxial S/D features 240 may be formed by an epitaxial growth method using CVD, ALD or molecular beam epitaxy (MBE). The epitaxial S/D features 240 are formed in contact with the epitaxial layers 216 of the fins 220. The epitaxial S/D features 240 may be merged or separated from each other. In some embodiment, cavities 236 (shown in FIGS. 13A and 13B) are not filled by the inner spacer material 238 but be capped by the epitaxial S/D features 240. Therefore, cavities 236 is also referred to as "air spacer".

Figure 16B:
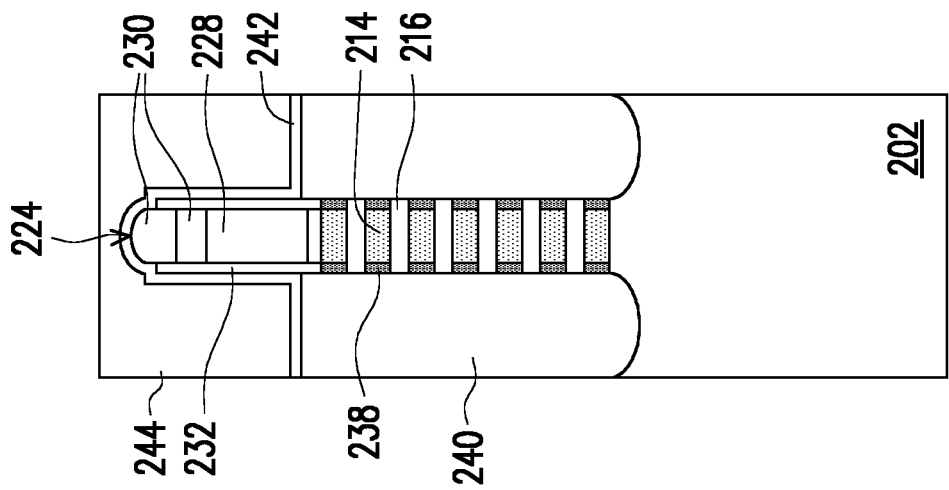
Figure 16A:
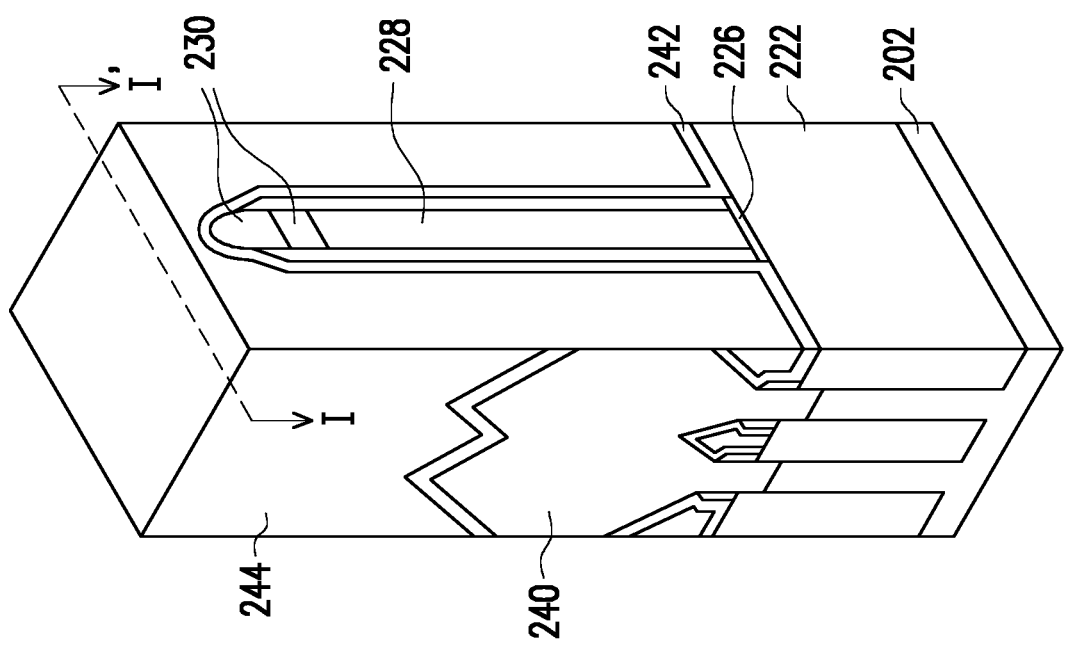
Figure 17B:
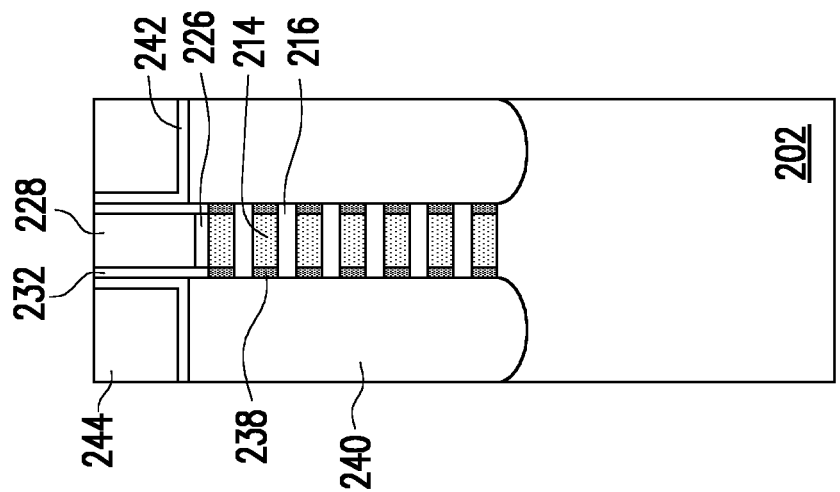
Figure 17A:
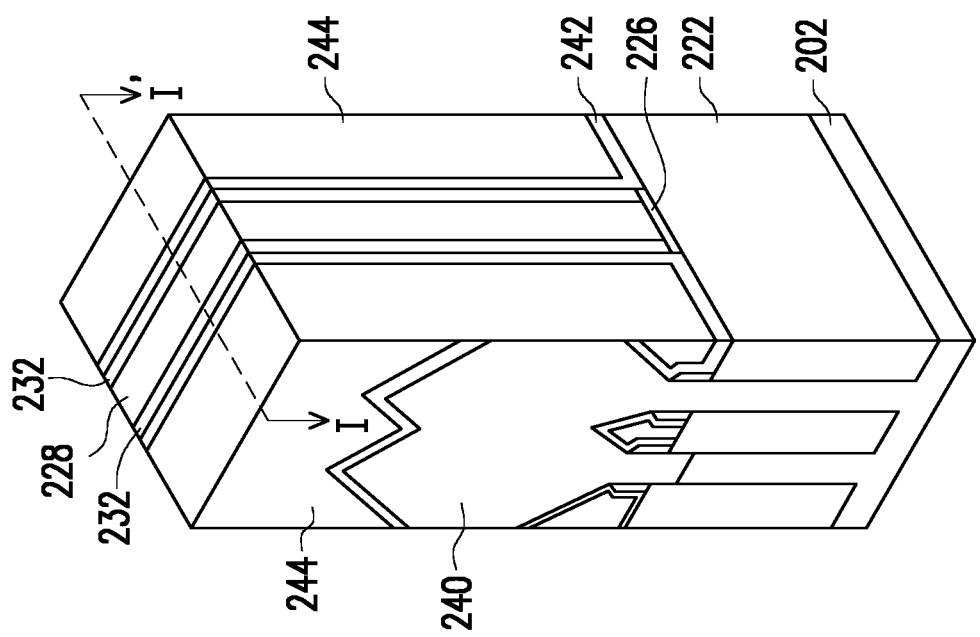

At operation S622, the method 600 (FIG. 21B) forms a contact etch stop layer (CESL) 242 over the epitaxial S/D features 240 and an interlayer dielectric (ILD) layer 244 over the CESL layer 242, as shown in FIGS. 16A and 16B, where FIG. 16B is a cross-sectional view along I-I' line of the device 200 in FIG. 16A. The CESL layer 242 may comprise, for example, silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. In some embodiments, forming the CESL 242 and the ILD layer 244 further includes performing a CMP process to planarize a top surface of the device 200, such that the top surfaces of the sacrificial gate electrode layer 228 are exposed, as shown in FIGS. 17A and 17B, where FIG. 17B is a cross-sectional view along I-I' line of the device 200 in FIG. 17A.

At operation S624, the method 600 (FIG. 21B) removes the sacrificial gate structures 224 and the sacrificial gate dielectric layer 226 to form gate trenches 254, as shown in FIGS. 18A and 18B, where FIG. 18B is a cross-sectional view along I-I' line of the device 200 in FIG. 18A. The ILD layer 244 and the CESL layer 242 protects the epitaxial S/D features 240 during the removal of the sacrificial gate structure 224. The sacrificial gate structure 224 may be removed using plasma dry etching and/or wet etching. When the sacrificial gate electrode layer 228 is polysilicon and the ILD layer 244 is silicon oxide, a wet etchant such as a TMAH solution may be used to selectively remove the sacrificial gate electrode layer. The sacrificial gate dielectric layer 226 is thereafter removed using plasma dry etching and/or wet etching.

Figure 19B:
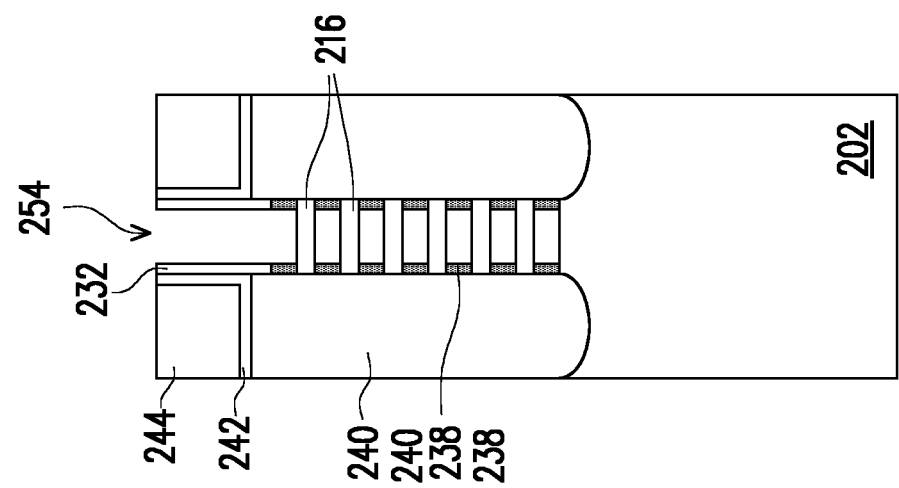
Figure 19A:
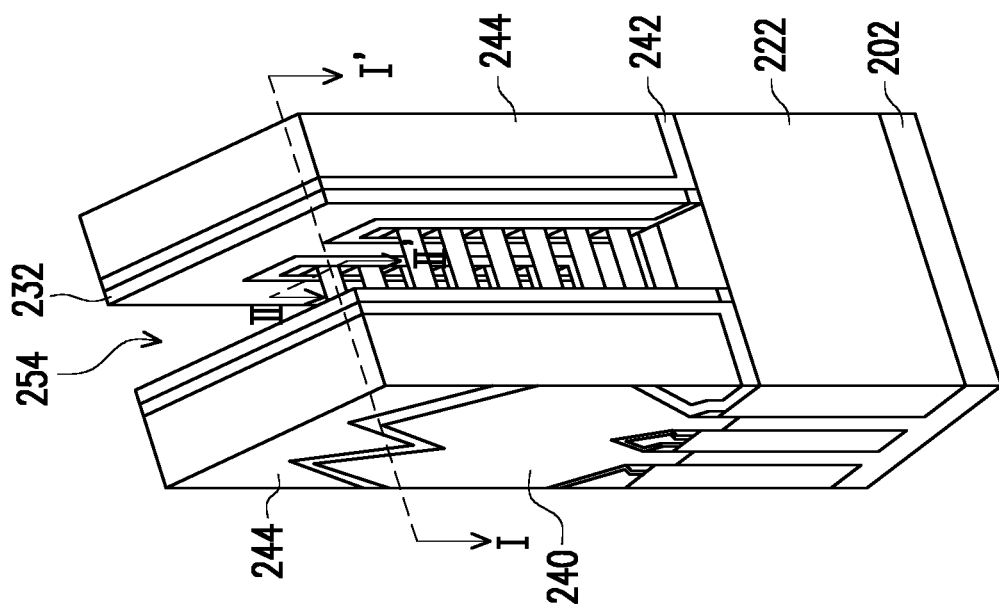

At operation S626, the method 600 (FIG. 21B) releases channel members from the channel region of the GAA device 200, as shown in FIGS. 19A, 19B and 19C, where FIG. 19B is a cross-sectional view along I-I' line of the device 200 in FIG. 19A, and FIG. 19C is a cross-sectional view along II-II' line of the device 200 in FIG. 19A. In the illustrated embodiment, channel members are epitaxial layers 216 in the form of nanosheets. In the present embodiment, the epitaxial layers 216 include silicon, and the epitaxial layers 214 include silicon germanium. The plurality of epitaxial layers 214 may be selectively removed. In some implementations, the selectively removal process includes oxidizing the plurality of epitaxial layers 214 using a suitable oxidizer, such as ozone. Thereafter, the oxidized epitaxial layers 214 may be selectively removed. To further this embodiment, the operation S626 includes a dry etching process to selectively remove the epitaxial layers 214, for example, by applying an HCl gas at a temperature of about 0° C. to about 150° C., or applying a gas mixture of $CF_4$, $SF_6$, $CHF_3$, HF, $NH_3$, $F_2$, $ClF_3$, $N_2$, Ar, and/or He. For the sake of simplicity and clarity, after operation S628, the epitaxial layers 216 are denoted as nanosheets 216. At this point, as shown in FIG. 19A, vertically stacked nanosheets 216 are formed in the channel regions of GAA device.

Figure 20B:
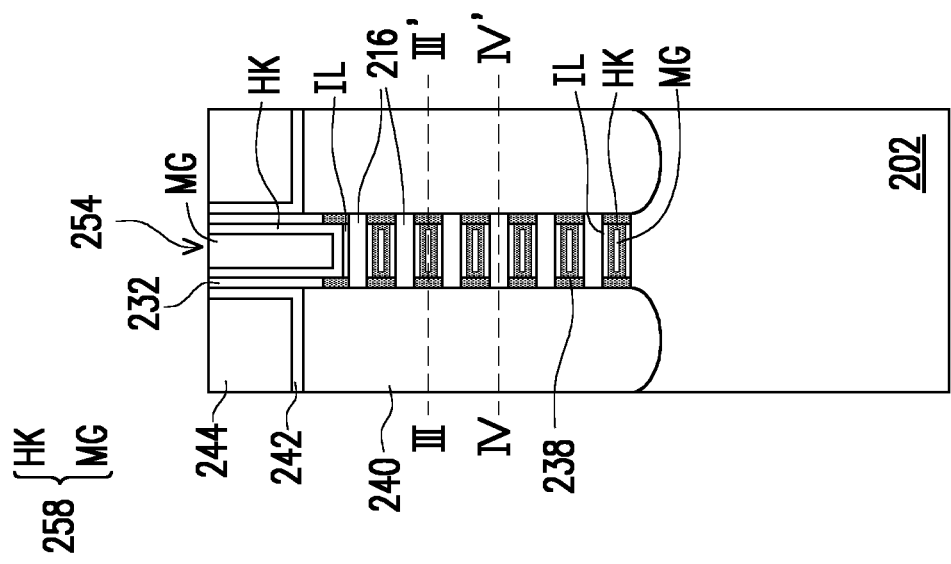
Figure 20A:
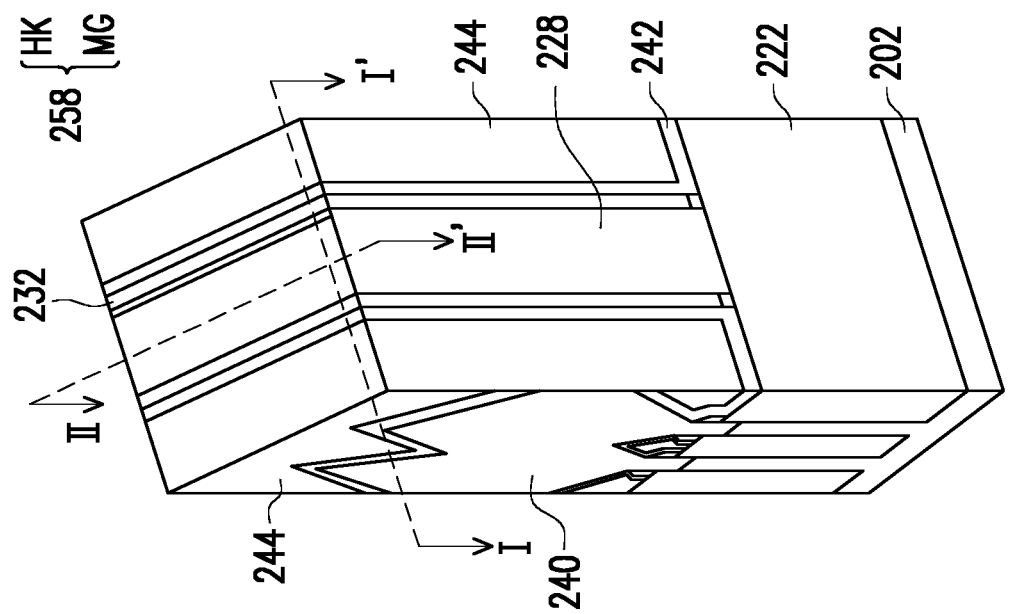
Figure 20C:
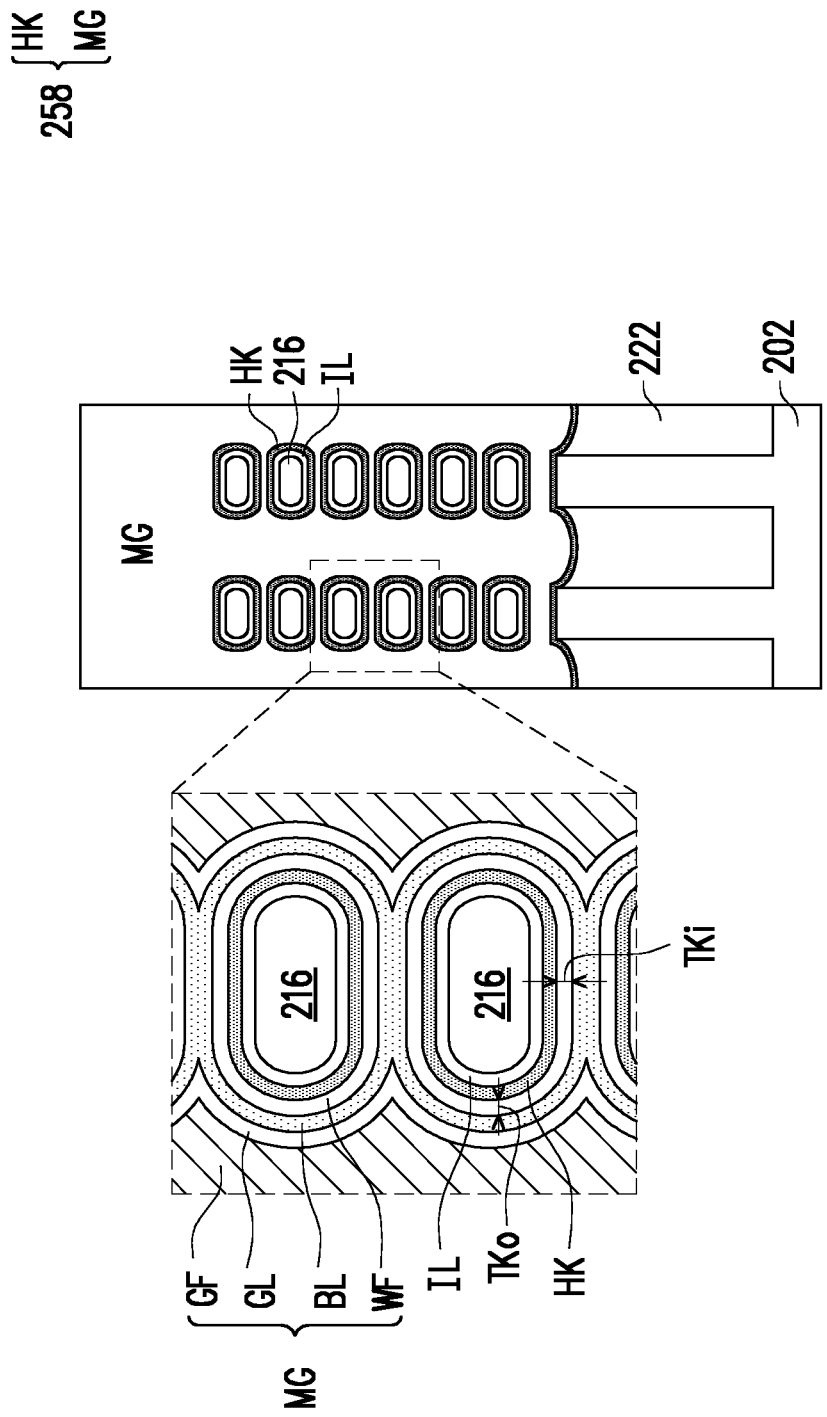
Figure 20E:
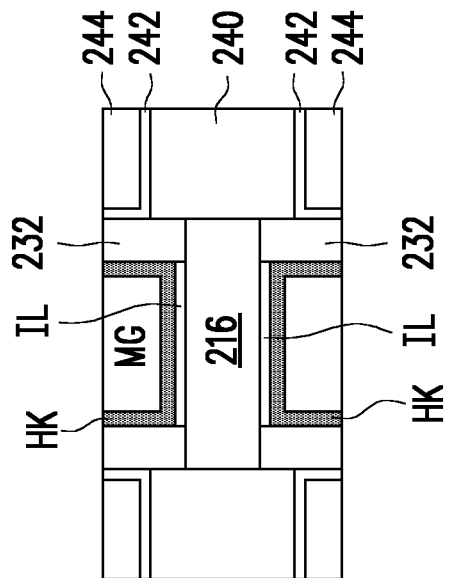
FIGS. 20D and 20E are fragmentary cross-sectional views along the III-III' line and IV-IV' of the semiconductor devices in FIG. 20B at other various stages of fabrication in accordance with some embodiments of the present disclosure.
Figure 20D:
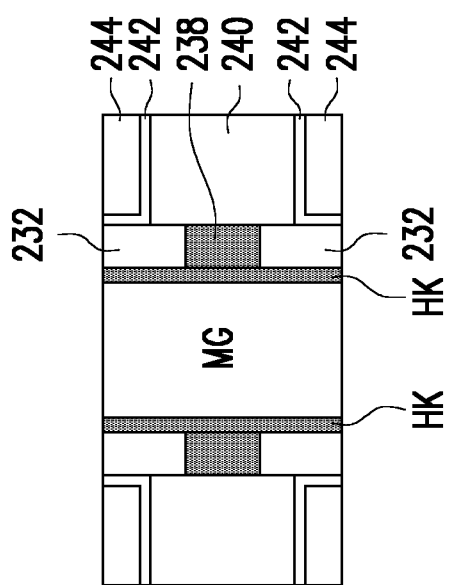

At operation S628, the method 600 (FIG. 21B) forms a metal gate structure (or referred to as a gate stack) 258 engaging the nanosheets 216 in the channel region, as shown in FIGS. 20A, 20B, 20C, 20E and 20E, where FIG. 20B is a cross-sectional view along I-I' line of the device 200 in FIG. 20A, FIG. 20C is a cross-sectional view along II-II' line of the device 200 in FIG. 20A, FIG. 20D is a cross-sectional view along III-III' line of the device 200 in FIG. 20B, and FIG. 20E is a cross-sectional view along IV-IV' line of the device 200 in FIG. 20B.

The metal gate structure 258 may include a high-k layer HK disposed on an insulating layer IL, and a metal gate electrode MG on the high-k layer HK. The high-k layer HK and the metal gate electrode MG are form to wrap each nanosheet 216 in the channel region. The inner spacers 238 separate the metal gate electrode MG from the epitaxial S/D features 240. The metal gate electrode MG includes a work function layer WF, a barrier layer BL, a glue layer GL, and a gate fill material GF sequentially on the high-k layer HK in some embodiments. Each of the high-k layer HK, the work function layer WF, the glue layer GL, and the gate fill material GF may be deposited by using physical vapor deposition (PVD), molecular-beam deposition (MBD), atomic layer deposition (ALD), chemical vapor deposition (CVD), sputtering, or other known processes, depending on the material composition of the layer. The metal gate structure 258 may be formed by the method 630 as shown in FIG. 21C.

At operation S632, the method 630 (FIG. 21C) forms the insulating layer IL wrapping each nanosheet 216 in the channel region. The insulating layer IL may be deposited or thermally grown respectively on the nanosheet 216 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The thickness of the insulating layer IL is in a range from about 0.7 nm to about 2.5 nm in some embodiments.

At operation S634, the method 630 forms the high-k layer (or referred to as a gate dielectric layer) HK on the insulating layer IL. The formation methods of the high-k layer HK may include molecular-beam deposition (MBD), ALD, PECVD, and the like. The high-k layer may have a dielectric constant greater than, for example, about 3.9 (the dielectric constant of silicon dioxide) or greater than about 7.0, and be made of, but not limited to, a metal oxide or a silicate of Hf, Al, Zr, La, Mg, Ba, Ti, Pb, and combinations thereof. Alternatively, the high-k layer HK may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$(BTO), BaZrO, HfZrO, HfLaO, HfSiO, LaSiO, AlSiO, HfTaO, HfTiO, $(Ba,Sr)TiO_3$(BST), $Al_2O_3$, $Si_3N_4$, oxynitrides (SiON), combinations thereof, or other suitable material. The thickness of the high-k layer HK is in a range from about 1 nm to about 4 nm in some embodiments.

At operation S636, the method 630 forms the work function layer WF on each high-k layer HK surrounding each nanosheet 216 in the channel region. The work function layer WF is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, TiAlC, HfTi, TiSi and TaSi is used as the work function adjustment layer, and for the p-channel FET, one or more of TiAlC, Al, TiAl, TaN, TaAlC, TiN, TiC and Co is used as the work function layer. The work function layers WF may be formed by ALD, PVD, CVD, e-beam evaporation, or other suitable process. Further, the work function layer WF may be formed separately for the n-channel FET and the p-channel FET which may use different metal layers. The thickness of the work function layer WF is in a range from about 5 nm to about 50 nm in some embodiments. The insulating layer IL, the high-k layer HK, and the work function layer WF are formed in outer sheet regions $R_o$ and further formed in inner sheet regions $R_i$ to surround each nanosheet 216 in the channel region. The inner sheet region $R_i$ is a region which is located between two adjacent nanosheets 216 of the same fin 220 in the longitudinal direction, while the outer region sheet region $R_o$ is a region surrounding the nanosheet 216 other than the inner sheet region $R_i$. Two adjacent work function layers WF in the inner sheet region $R_i$ are separated each other and are not merged. In other words, the two adjacent work function layers WF in the inner sheet region $R_i$ are not in contact with each other and there is a space between the two adjacent work function layers WF in the inner sheet region $R_i$.

At operation S638, the method 630 forms the barrier layer BL on each work function layer WF. The barrier layer BL is made of a conductive material including a single layer or a multilayer. In some embodiments in which the work function layer WF includes a single layer or a multilayer and the single layer or a most outer layer of the multilayer includes a non-nitride material such as TaAlC, TiC, TaC, Co, Al, TiAl, HfTi, TiSi, TaSi or TiAlC, the barrier layer BL includes a nitride of metal such as TiN, TaN, or Si-doped TiN (TSN), of two or more of these materials. The barrier layer BL may be formed by ALD, PVD, CVD, e-beam evaporation, or other suitable process. The thickness of the barrier layer BL is in a range from about 5 nm to about 30 nm in some embodiments.

The barrier layer BL is formed in the outer sheet region $R_o$ and further formed in the inner sheet region $R_i$ to fill the space between the two adjacent work function layers WF in the inner sheet region $R_i$. The barrier layer BL separates the two adjacent work function layers WF in the inner sheet region $R_i$. Therefore, the work function layer WF has an inner thickness $TK_i$ in the inner sheet region $R_i$ is substantially the same as an outer thickness $TK_o$ of the work function layer WF in the outer sheet region $R_o$. Further, in some embodiments in which the work function layer WF includes Al, the barrier layer BL is used to prevent the movement of Al from the work function layer WF.

At operations S640 and S642, the method 630 forms the glue layer GL on each barrier layer BL, and forms the gate fill material GF on the glue layer GL. The glue layer GL may include TiN or similar material. In some embodiments, the material of the glue layer GL may have desirable affinity to the material of the gate fill material GF, such that the gate fill material GF may be firmly adhered to the glue layer GL. The gate fill material GF disposed on the glue layer GL1 may be formed by a conductive material such as W, TiN, TaN, WN, Re, Ir, Ru, Mo, Al, Cu, Co, Ni, combinations thereof, and/or other suitable compositions.

The high-k layer HK, the work function layer WF, the barrier layer BL, the glue layer GL, and the gate fill material GF may also be deposited over the upper surfaces of the ILD layer 244 and the CESL layer 242. The high-k layer HK, the work function layer WF, the barrier layer BL, the glue layer GL, and the gate fill material GF formed over the ILD layer 244 and the CESL layer 242 are then planarized by using, for example, CMP, until the top surfaces of the ILD layer 244 and the CESL layer 242 is revealed. In some embodiments, after the planarization operation, the metal gate electrode MG is recessed and a cap insulating layer (not shown) is formed over the recessed metal gate electrode MG. The cap insulating layer includes one or more layers of a silicon nitride-based material, such as SiN. The cap insulating layer may be formed by depositing an insulating material followed by a planarization operation.

Although not intended to be limiting, one or more embodiments of the present disclosure provide many benefits to a semiconductor device and the formation thereof. The present disclosure provides methods of forming a gate stack including a capping layer between the work function layer and the glue layer so as to prevent from the material diffusion from the overlying layers or atmosphere to the work function layer so that the work function layer may be ensured.

The present disclosure also provides methods of forming a semiconductor device having transistors with TiN or TaN, TaAlC and TiAlC as work function layers to achieve a multi-Vt (threshold voltage) design.

The present disclosure still also provides methods of forming a GAA device including a barrier layer disposed between two adjacent work function layers in the inner sheet region. Accordingly, this provides a benefit of work function layers with fewer merge defect and less movement of Al, thereby improving the reliability and performance of the GAA device. Furthermore, the GAA flow with a barrier layer may be easily integrated into existing semiconductor fabrication processes.

In accordance with some embodiments of the disclosure, a semiconductor device may include a substrate, a first gate structure, and a second gate structure. The first gate structure is disposed on the substrate. The first gate structure includes a first capping layer and a first underlying layer below the first capping layer. The second gate structure is disposed on the substrate. The second gate structure includes a second capping layer and a second underlying layer below the second capping layer. The material of the first capping layer and the second capping layer have a material having higher resistant to oxygen or fluorine than materials of the first underlying layer and the second underlying layer. The first capping layer, the second capping layer and the second underlying layer include a same metal element.

In accordance with some embodiments of the disclosure, a semiconductor device may include a substrate, a first gate structure, and a second gate structure. The first gate structure is disposed on the substrate, wherein the first gate structure comprises a first high-k layer, a first work function layer, and a first capping layer sequentially disposed on the substrate. The second gate structure is disposed on the substrate, wherein the second gate structure comprises a second high-k layer, a second work function layer, and a second capping layer sequentially disposed on the substrate. The material of the first capping layer and the second capping layer comprise a material having higher resistant to oxygen or fluorine than materials of the second work function layer.

In accordance with some embodiments of the disclosure, a semiconductor device may include a substrate, a first semiconductor nanosheet, a second semiconductor nanosheet, and a gate stack. The first semiconductor nanosheet is disposed over the substrate. The second semiconductor nanosheet is disposed over the semiconductor nanosheet. The gate stack wraps the first semiconductor nanosheet and the second semiconductor nanosheet. The gate stack comprises a gate fill material, a first barrier layer, and a second barrier layer. The gate fill material surrounds the first semiconductor nanosheet and the second semiconductor nanosheet. The first barrier layer is disposed between the first semiconductor nanosheet and the gate fill material. The second barrier layer surrounds the second semiconductor nanosheet and the gate fill material. The first barrier layer and the second barrier layer are disposed between the first semiconductor nanosheet and the second semiconductor nanosheet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first gate structure disposed on the substrate, wherein the first gate structure comprises a first capping layer and a first underlying layer below the first capping layer; and
a second gate structure disposed on the substrate, wherein the second gate structure comprises a second capping layer and a second underlying layer below the second capping layer,
wherein the material of the first capping layer and the second capping layer comprise a material having higher resistant to oxygen or fluorine than materials of the first underlying layer and the second underlying layer,
wherein the first capping layer, the second capping layer and the second underlying layer comprise a same metal element.

2. The semiconductor device of claim 1, wherein the same metal element comprises aluminum element or tungsten.

3. The semiconductor device of claim 2, wherein the first capping layer and the second capping layer comprise a metal nitride, and the metal nitride comprises a nitride of aluminum and a nitride of tungsten.

4. The semiconductor device of claim 3, wherein materials of the first capping layer and the second capping layer comprises aluminum nitride (AlxNy), titanium aluminum nitride (TiAlN), tantalum aluminum nitride (TaAlN), tungsten aluminum nitride (WAlN), tungsten nitride (WN) or a combination thereof, where 'x' is equal to about 1 to 3; and 'y' is equal to about 1 to 3.

5. The semiconductor device of claim 1, wherein the first gate structure comprises a first high-k layer, a first work function layer, an overlying work function layer, and the first capping layer sequentially disposed on the substrate.

6. The semiconductor device of claim 5, wherein a material of the overlying work function layer is the same as a material of the second work function layer.

7. The semiconductor device of claim 1, wherein the second gate structure comprising a second high-k layer, a second work function layer, and the second capping layer sequentially disposed on the substrate.

8. The semiconductor device of claim 7, wherein the second work function layer comprises TiAl, TiAlC, TaAl, TaAlC, or a combination thereof.

9. A semiconductor device, comprising:
a substrate;
a first gate structure disposed on the substrate, wherein the first gate structure comprises a first high-k layer, a first work function layer, and a first capping layer sequentially disposed on the substrate; and
a second gate structure disposed on the substrate, wherein the second gate structure comprises a second high-k layer, a second work function layer, and a second capping layer sequentially disposed on the substrate,
wherein the material of the first capping layer and the second capping layer comprise a material having higher resistant to oxygen or fluorine than materials of the second work function layer.

10. The semiconductor device of claim 9, wherein the first work function layer comprises a first layer, the second work function layer comprises the first layer and a second layer on the first layer, and the first layer and the second layer are different.

11. The semiconductor device of claim 10, wherein the first layer comprises a TiN layer or a TaN layer, and the second layer comprises a TaAlC layer.

12. The semiconductor device of claim 11, further comprising:
a third gate structure disposed on the substrate, wherein the third gate structure comprises a third high-k layer and a third work function layer sequentially disposed on the substrate,
wherein a material of the third work function layer comprises Ti element and Al element.

13. The semiconductor device of claim 12, wherein the material of the third work function layer comprises the first layer and a third layer on the first layer, and the first layer and the third layer are different.

14. The semiconductor device of claim 13, wherein the third layer comprises TiAlC.

15. A semiconductor device, comprising:
a substrate;
a first semiconductor nanosheet disposed over the substrate;
a second semiconductor nanosheet disposed over the semiconductor nanosheet; and
a gate stack wrapping the first semiconductor nanosheet and the second semiconductor nanosheet, wherein the gate stack comprises:
a gate fill material surrounding the first semiconductor nanosheet and the second semiconductor nanosheet;
a first barrier layer between the first semiconductor nanosheet and the gate fill material; and
a second barrier layer surrounding the second semiconductor nanosheet and the gate fill material,
wherein the first barrier layer and the second barrier layer are disposed between the first semiconductor nanosheet and the second semiconductor nanosheet.

16. The semiconductor device of claim 15, wherein the first barrier layer and the second barrier layer are disposed between the first semiconductor nanosheet and the second semiconductor nanosheet are merged.

17. The semiconductor device of claim 15, further comprising:
a first work function layer between the first semiconductor nanosheet and the first barrier layer; and
a second work function layer between the second semiconductor nanosheet and the second barrier layer.

18. The semiconductor device of claim 17, wherein the first work function layer and the second work function layer between the first semiconductor nanosheet and the second semiconductor nanosheet are separated by the first barrier layer and the second barrier layer.

19. The semiconductor device of claim 18, wherein the first barrier layer and the second barrier layer comprise a nitride of metal, and the nitride of metal comprises TiN, TaN, Si-doped TiN (TSN), or a combination thereof.

20. The semiconductor device of claim 18, wherein the first work function layer and the second work function layer comprise TaAlC, TiC, TaC, Co, Al, TiAl, HfTi, TiSi, TaSi, TiAlC, or a combination thereof.

* * * * *